(12) United States Patent
Takahashi et al.

(10) Patent No.: US 9,268,222 B2
(45) Date of Patent: Feb. 23, 2016

(54) PHOTOSENSITIVE NEGATIVE RESIN COMPOSITION, FINE STRUCTURE, PRODUCTION PROCESS OF FINE STRUCTURE AND LIQUID EJECTION HEAD

(71) Applicant: CANON KABUSHIKI KAISHA, Tokyo (JP)

(72) Inventors: Hyou Takahashi, Kunitachi (JP); Kyosuke Nagaoka, Kodaira (JP); Masako Shimomura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 90 days.

(21) Appl. No.: 14/360,401

(22) PCT Filed: Jan. 25, 2013

(86) PCT No.: PCT/JP2013/052427
§ 371 (c)(1),
(2) Date: May 23, 2014

(87) PCT Pub. No.: WO2013/115393
PCT Pub. Date: Aug. 8, 2013

(65) Prior Publication Data
US 2014/0329175 A1   Nov. 6, 2014

(30) Foreign Application Priority Data
Jan. 31, 2012   (JP) ................. 2012-018673

(51) Int. Cl.
G03F 7/004  (2006.01)
G03F 7/027  (2006.01)
G03F 7/038  (2006.01)
G03F 7/075  (2006.01)
B41J 2/14   (2006.01)

(52) U.S. Cl.
CPC . G03F 7/027 (2013.01); B41J 2/14 (2013.01); G03F 7/0045 (2013.01); G03F 7/038 (2013.01); G03F 7/0751 (2013.01); G03F 7/0755 (2013.01)

(58) Field of Classification Search
CPC ....... G03F 7/004; G03F 7/0045; G03F 7/038; G03F 7/027; G03F 7/0755; G03F 7/0751; B41J 2/14

USPC ................... 430/18, 280.1, 322; 347/20
See application file for complete search history.

(56) References Cited

U.S. PATENT DOCUMENTS

| | | |
|---|---|---|
| 5,478,606 A | 12/1995 | Ohkuma et al. |
| 8,278,030 B2 | 10/2012 | Suzuki et al. |
| 8,394,575 B2 | 3/2013 | Wu et al. |
| 2003/0185996 A1 | 10/2003 | Shimomura et al. |
| 2005/0119362 A1 | 6/2005 | Ishikawa |
| 2006/0128822 A1 | 6/2006 | Katou et al. |
| 2008/0292986 A1 | 11/2008 | Park et al. |
| 2008/0292993 A1 | 11/2008 | Ishikura et al. |
| 2011/0244393 A1 | 10/2011 | Ikeda |
| 2012/0040288 A1 | 2/2012 | Adams et al. |
| 2012/0229556 A1 | 9/2012 | Ikegame et al. |
| 2013/0235119 A1 | 9/2013 | Takahashi et al. |

FOREIGN PATENT DOCUMENTS

| | | |
|---|---|---|
| EP | 1 550 677 A1 | 7/2005 |
| EP | 2 197 839 B1 | 1/2013 |
| JP | 4-10940 A | 1/1992 |
| JP | 3143307 B2 | 3/2001 |
| JP | 2005-075885 A * | 3/2005 |
| JP | 2008-256980 A | 10/2008 |
| JP | 2011-164216 A | 8/2011 |
| WO | 2006/046411 A1 | 5/2006 |
| WO | 2009/104643 A1 | 8/2009 |
| WO | 2009/136482 A1 | 11/2009 |
| WO | 2010/001919 A1 | 1/2010 |
| WO | WO 2011/096195 A1 * | 8/2011 |

OTHER PUBLICATIONS

Computer-generated translation of JP 2005-075885 (Mar. 2005).*

* cited by examiner

*Primary Examiner* — John A McPherson
(74) *Attorney, Agent, or Firm* — Fitzpatrick, Cella, Harper & Scinto

(57) ABSTRACT

A photosensitive negative resin composition containing a resin (a) having at least three cyclohexene oxide skeletons in its molecule, an onium salt (b) composed of a cation moiety structure represented by the formula b1 defined in the description and an anion moiety structure represented by the formula b2 defined in the description, a silane compound (c) and an organic solvent (d). A fine structure using the resin composition, a production process of the fine structure and a liquid ejection head.

11 Claims, 4 Drawing Sheets

PHOTOSENSITIVE NEGATIVE RESIN COMPOSITION, FINE STRUCTURE, PRODUCTION PROCESS OF FINE STRUCTURE AND LIQUID EJECTION HEAD

TECHNICAL FIELD

The present invention relates to a photosensitive negative resin composition, a fine structure using the photosensitive negative resin composition, a production process of the fine structure and a liquid ejection head.

BACKGROUND ART

As a microprocess technology, such a photolithographic technology that a negative photosensitive resin is subjected to exposure and development to form a structure (fine structure) having a fine pattern is known. This technology is used in a wide variety of applications to, for example, production of semiconductor integrated circuits, production of masks for semiconductor exposure and production of various MEMSs (micro electro mechanical systems). As an example of the application to the production of the MEMS, it has been increasingly practically applied in various small-scale sensors, micro-probes, thin film magnetic heads, ink jet recording heads, etc. A stepper using i-line as a light source is widely used as a device for conducting exposure. In the field of this technology, it has been required in recent years to produce a structure having a more complicated and finer structure, and there has thus been a demand for development of a negative photosensitive resin capable of forming a fine structure exhibiting high accuracy to light from a light source through a photomask.

Patent Literature 1 discloses, as a negative photosensitive resin, a photosensitive resin composition containing a polyfunctional epoxy resin and a cationic polymerization initiator.

Patent Literature 2 discloses an ink jet head for production of an MEMS, including a nozzle which ejects an ink droplet by allowing a bubble formed by heating a heating resistor to communicate with the air. This patents also discloses, as a covering resin used for forming an ink flow path wall of this ink jet head, a resin composition containing an epoxy resin that is solid at ordinary temperature as a main component.

CITATION LIST

Patent Literature

PTL 1: Japanese Patent Application Laid-Open No. 2008-256980

PTL 2: Japanese Patent No. 3143307

SUMMARY OF INVENTION

The present invention provides a photosensitive negative resin composition comprising a resin (a) having at least three cyclohexene oxide skeletons in its molecule, an onium salt (b) composed of a cation moiety structure represented by the following formula b1 and an anion moiety structure represented by the following formula b2, a silane compound (c) and an organic solvent (d).

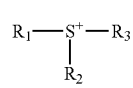
Formula b1

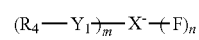
Formula b2 wherein $R_1$ to $R_3$ are, independently of one another, an organic group which may be substituted and has 1 to 30 carbon atoms, with the proviso that two or more oxygen atoms are included in all atoms constituting $R_1$ to $R_3$, $R_1$ and $R_2$, $R_2$ and $R_3$, and $R_1$ and $R_3$ may be bonded to each other directly or through a linking group to form a cyclic structure, $R_4$ is a hydrocarbon group which may be substituted by a fluorine atom and has 1 to 30 carbon atoms, X is a carbon atom, a nitrogen atom, a phosphorus atom or a boron atom, $Y_1$ is —S(=O)$_2$—, an alkylene fluoride group, -*$_1$—O—CF$_2$—, -*$_1$—C(=O)—CF$_2$—, -*$_1$—O—C(=O)—CF$_2$—, -*$_1$—C(=O)—O—CF$_2$— or a single bond, where *$_1$ designates an end bonded to $R_4$, n is 0, 1 or 2 when X is the carbon atom with the proviso that a total of m and n is 3, n is 0 or 1 when X is the nitrogen atom with the proviso that a total of m and n is 2, n is an integer of 0 or more and 6 or less when X is the phosphorus atom with the proviso that a total of m and n is 6, n is an integer of 0 or more and 3 or less when X is the boron atom with the proviso that a total of m and n is 4, and when m is an integer of 2 or more, any carbon atom in one $R_4$—$Y_1$— group of two or more $R_4$—$Y_1$— groups bonded to X may be bonded to any carbon atom in another one $R_4$—$Y_1$— group thereof through a single bond, thereby forming a cyclic structure].

The present invention also provides a fine structure formed on a substrate, wherein the fine structure is a cured product of the above-described photosensitive negative resin composition. The present invention further provides a liquid ejection head in which a flow path forming layer is formed by this fine structure. The present invention still further provides a production process of a fine structure, comprising (1) a step of arranging the above-described photosensitive negative resin composition on a substrate and (2) a step of subjecting the photosensitive negative resin composition to a patterning treatment by photolithography using i-line light.

Further features of the present invention will become apparent from the following description of exemplary embodiments with reference to the attached drawings.

DESCRIPTION OF EMBODIMENTS

Figure 1:
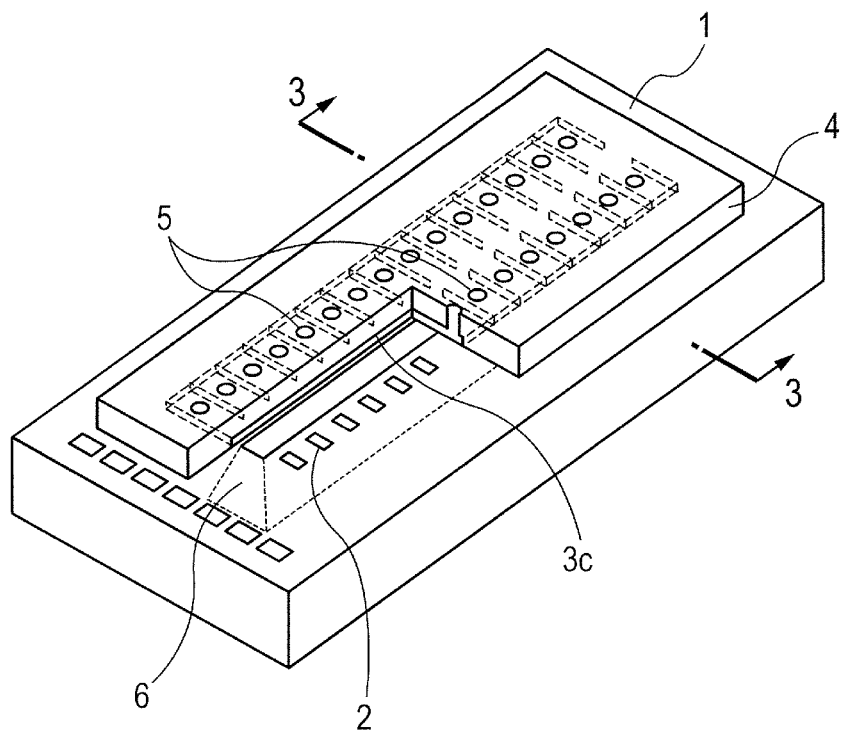
FIG. 1 is a typical perspective view illustrating the construction of an exemplary liquid ejection head.

According to the resin compositions described in Japanese Patent Application Laid-Open No. 2008-256980 and Japanese Patent No. 3143307, it may have been difficult in some cases to obtain a nozzle that does not cause peeling even when stored in a pigment ink, and hence is excellent in pigment ink resistance with high sensitivity and high resolution when a photolithographic process is applied thereto.

The present invention has been made in view of the above problem and has as its object the provision of a photosensitive negative resin composition capable of producing a fine structure (for example, a nozzle) excellent in pigment ink resistance with high sensitivity and high resolution when the photolithographic process is applied thereto. Another object of the present invention is to provide a fine structure using this photosensitive negative resin composition, a production process thereof and a liquid ejection head.

The photosensitive negative resin composition according to the present invention is suitable for formation of a fine structure (for example, a nozzle) using the photolithographic process and can form a fine structure excellent in pigment ink resistance with high sensitivity and high resolution. The photosensitive negative resin composition according to the present invention is excellent in resolution when photolithography is conducted by using i-line light in particular. The photosensitive negative resin composition according to the present invention will hereinafter be described in detail.

Photosensitive negative resin composition: The photosensitive negative resin composition according to the present invention contains a first epoxy resin (a), a first onium salt (b), a silane compound (c) and an organic solvent (d), which will be described subsequently. This photosensitive negative resin composition may also contain a second epoxy resin (e), a second onium salt (f), a third onium salt (g), a third epoxy resin (h) and other components. These components contained in the photosensitive negative resin composition according to the present invention will hereinafter be described in detail.

First Epoxy Resin (a): Resin Having at Least Three Cyclohexene Oxide Skeletons in its Molecule No particular limitation is imposed on the first epoxy resin (a) used in the present invention so far as the resin has at least three cyclohexene oxide skeletons in its molecule (in its molecular structure). The resin has at least three cyclohexene oxide skeletons in its molecule, whereby high resolution is achieved. In addition, the first epoxy resin (a) favorably has 10 or less cyclohexene oxide skeletons in its molecule from the viewpoint of evenness of a coating surface.

The epoxy equivalent in the first epoxy resin (a) is favorably 130 or more from the viewpoint of water absorption properties of a cured product and is 400 or less from the viewpoint of resolution. From the viewpoints of high resolution and pigment ink resistance, a resin represented by the following formula a1 is favorably used as the first epoxy resin (a).

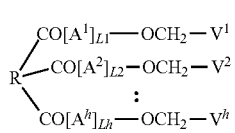

Formula a1

In the formula a1, R is a hydrocarbon group which may contain one or both of an alicyclic epoxy group and an ester group (—C(=O)—O—) and has 1 to 30 carbon atoms. However, this number of carbon atoms in this group also includes the number of carbon atoms in the alicyclic epoxy group and/or the ester group contained in the hydrocarbon group. In the present invention, the number of carbon atoms in R is controlled to 1 or more and 30 or less from the viewpoint of achieving high resolution. Incidentally, R may have a plurality of alicyclic epoxy groups or epoxy groups. In addition, R may be composed of the alicyclic epoxy group alone like a formula a1-3 described below.

The alicyclic epoxy group has such a structure that an epoxy group is bonded to an alicyclic group and means a group containing such alicyclic group and epoxy group. As examples of the alicyclic epoxy group, a cyclohexene oxide group and a 3-glycidylcyclohexyl group may be mentioned.

As examples of the hydrocarbon group, linear, branched or cyclic saturated hydrocarbon groups and linear, branched or cyclic unsaturated hydrocarbon groups (for example, aromatic hydrocarbon groups) may be mentioned. Among these, the hydrocarbon group is favorably a cyclohexyl group or a benzene ring from the viewpoint of solubility in an organic solvent. In addition, R may have a plurality of cyclohexyl groups or benzene rings like formulae a1-13 and a1-14 described below. R may also have such a structure that such groups or rings are bonded to each other through an ester group or the like. Incidentally, h side groups (for example, —CO[$A^1$]$_{L1}$—OCH$_2$—V$_1$) bonded to R in the formula a1 may be each bonded to the same carbon atom in R or to different carbon atoms in R.

$A^1$ to $A^h$ are, independently of one another, a group (may also referred to as "group A") composed of a linear or branched alkyl group having 1 to 9 carbon atoms and a group selected from the group consisting of —O— and —C(=O)—. At that time, the group A may be formed with one or more groups selected from this group. The group A may have a plurality of the same groups (for example, —O—) in this group. As examples of the group A, may be mentioned —O—$R_{30}$—C(=O)—*$_3$ and —O—$R_{30}$—O—C(=O)—*$_3$. Here, $R_{30}$ is a linear or branched alkyl group having 1 to 9 carbon atoms, and *$_3$ designates a linking position (an end on the side of the —OCH$_2$ group) with the —OCH$_2$ group in the formula a1. Incidentally, the number of carbon atoms in this alkyl group is controlled to 1 or more and 9 or less from the viewpoint of achieving high resolution. $A^1$ to $A^h$ may be the same group or different groups from one another.

$V^1$ to $V^h$ are, independently of one another, a group represented by the following formula a2.

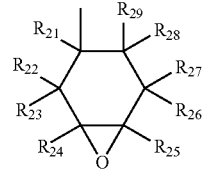

Formula a2

In the formula a2, $R_2$, to $R_{29}$ are, independently of one another, a hydrogen atom or an alkyl group having 1 to 9 carbon atoms. Incidentally, the number of carbon atoms in this alkyl group is controlled to 1 or more and 9 or less from the viewpoint of epoxy polymerizability, that is, of sensitivity.

Incidentally, the alkyl group in the present description includes a linear alkyl group, a branched alkyl group and a cyclic alkyl group unless expressly noted.

In the formula a1, $L_1$ to $L_h$ are, independently of one another, a number of 0 or more. That is, the first epoxy resin (a) (for example, Resin (a1-1) described below) may be a mixture of compounds satisfying the same formula (for example, a formula a1-1 described below). In that case, $L_1$ to $L_h$ in the formula a1 come to designate an average value of these compounds. Therefore, $L_1$ to $L_h$ may be each an integer or a decimal. Incidentally, when the resin (a) is a single compound, not a mixture, $L_1$ to $L_h$ are all an integer of 0 or more.

h in $A^h$, $L_h$ and $V^h$ is an integer of 2 or more. However, when h is 2, R in the formula a1 contains at least one cyclohexene oxide skeleton.

As favorable specific examples of the first epoxy resin (a), may be mentioned Resin (a1-1) to Resin (a1-14) respectively represented by the following formulae a1-1 to a1-14. These specific examples are favorable as the first epoxy resin (a) from the viewpoint of achieving both resolution and pigment ink resistance.

Incidentally, a total $(L_1+L_2+L_3+L_4)$ of $L_1$ to $L_4$ in each of the formulae a1-1, a1-5 to a1-10, a1-13, and a1-14 is a number of 0 or more and 20 or less. In addition, a total $(L_1+L_2+L_3)$ of $L_1$ to $L_3$ in each of the formulae a1-2, a1-11 and a1-12 is a number of 0 or more and 10 or less. Further, a total $(L_1+L_2)$ of $L_1$ and $L_2$ in the formula a1-3 is a number of 0 or more and 5 or less. A total $(L_1+L_2+L_3+L_4+L_5)$ of $L_1$ to $L_5$ in the formulae a1-4 is a number of 0 or more and 25 or less.

Incidentally, the following first epoxy resins (a) are commercially available.

Resin (a1-1):

Trade name: Epolead GT401 [product of Daicel Corporation; a resin with a total of $L_1$ to $L_4$ in the formula a1-1 of about 1; epoxy equivalent: 210 to 225].

Trade name: Epolead GT403 [product of Daicel Corporation; a resin with a total of $L_1$ and $L_4$ in the formula a1-1 of about 3; epoxy equivalent: 270 to 300].

Trade name: Epolead GT301 [product of Daicel Corporation; a resin with a total of $L_1$ and $L_2$ in the formula a1-3 of about 1; epoxy equivalent: 185 to 205].

Trade name: Epolead GT302 [product of Daicel Corporation; a resin with a total of $L_1$ and $L_2$ in the formula a1-3 of about 2; epoxy equivalent: 225 to 250].

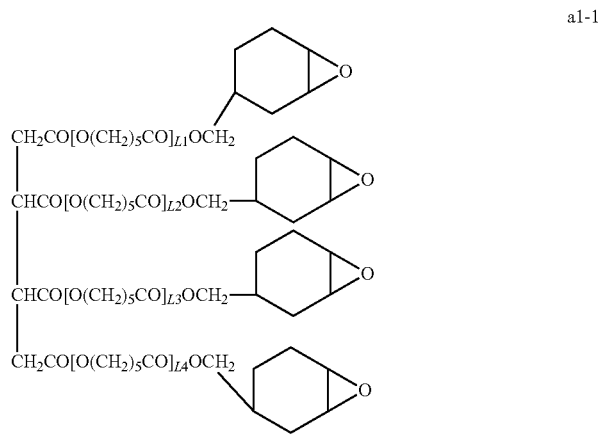

a1-1

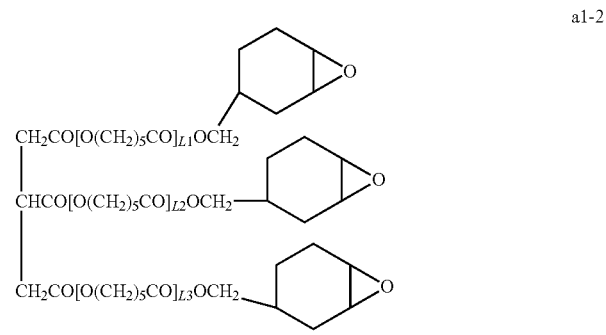

a1-2

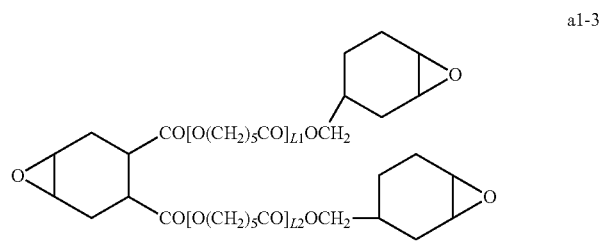

a1-3

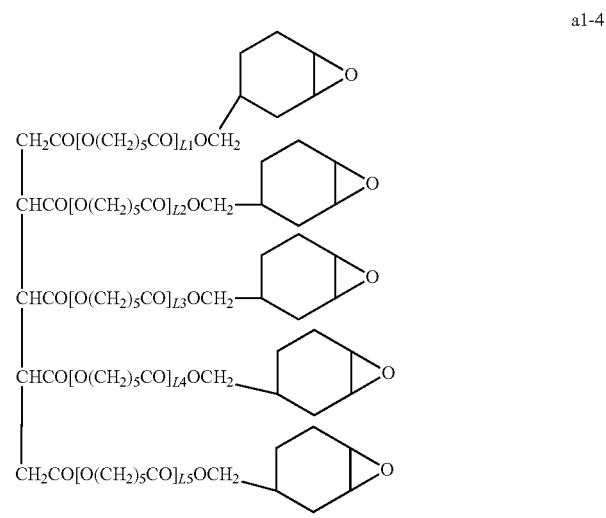

a1-4

-continued
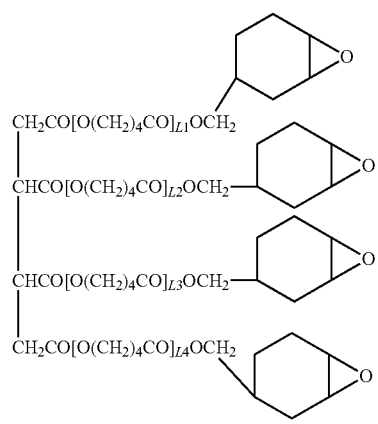
a1-5
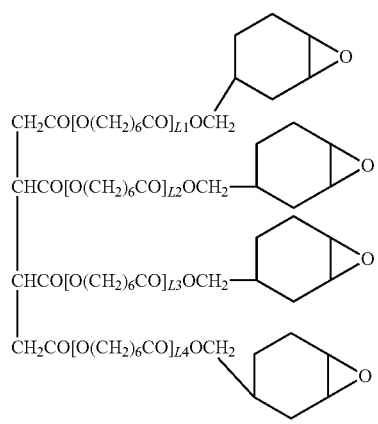
a1-6
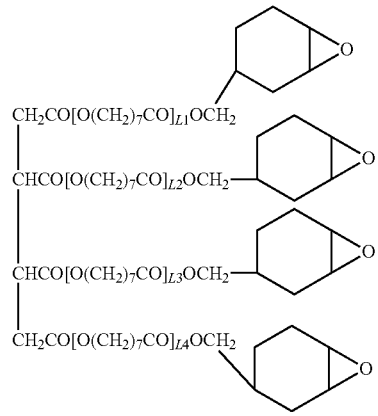
a1-7
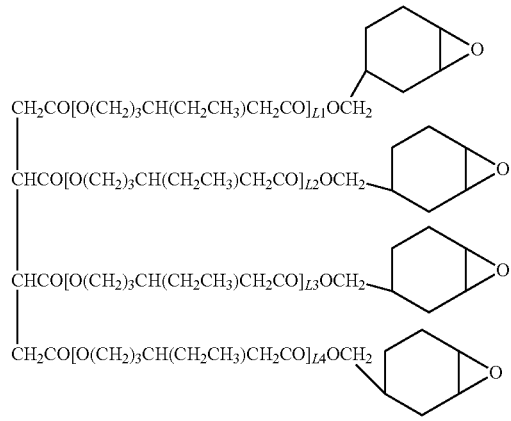
a1-8
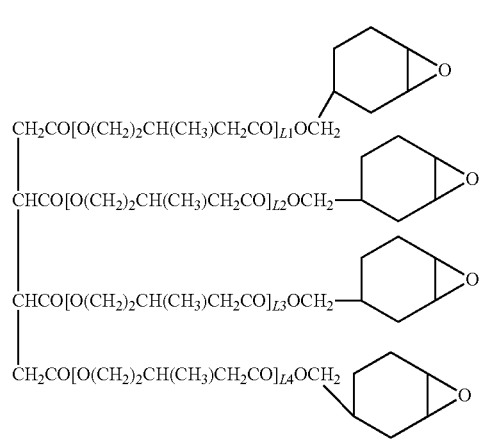
a1-9
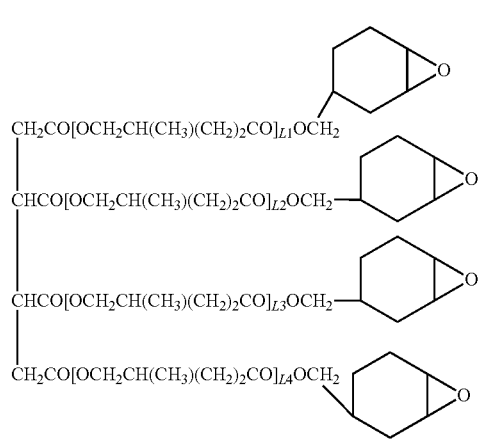
a1-10
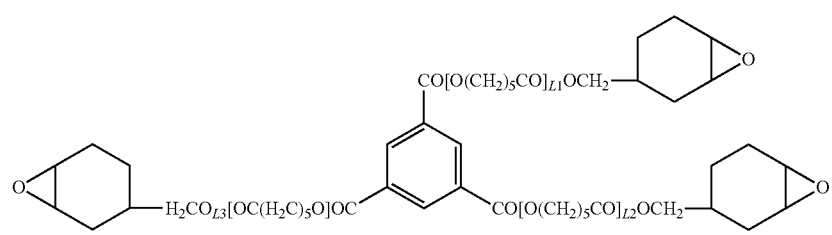
a1-11

-continued a1-12

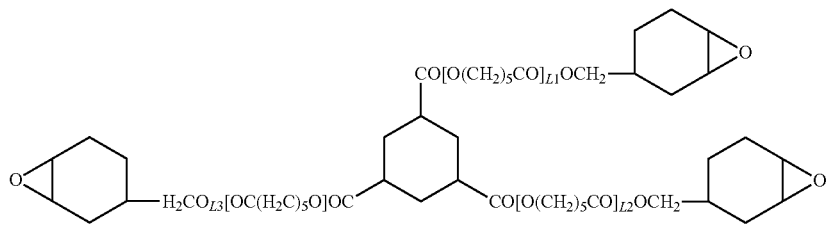

a1-13

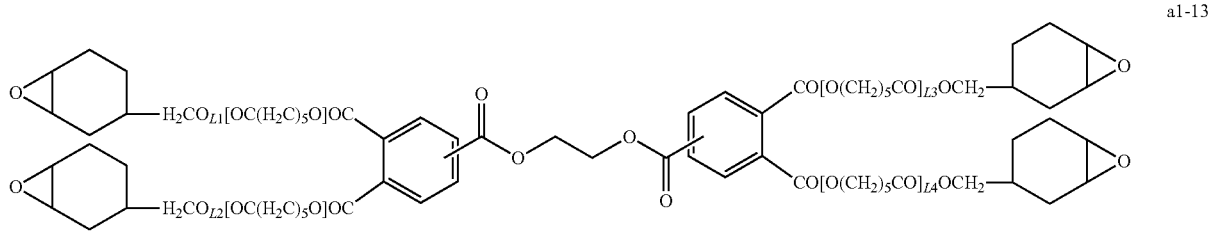

a1-14

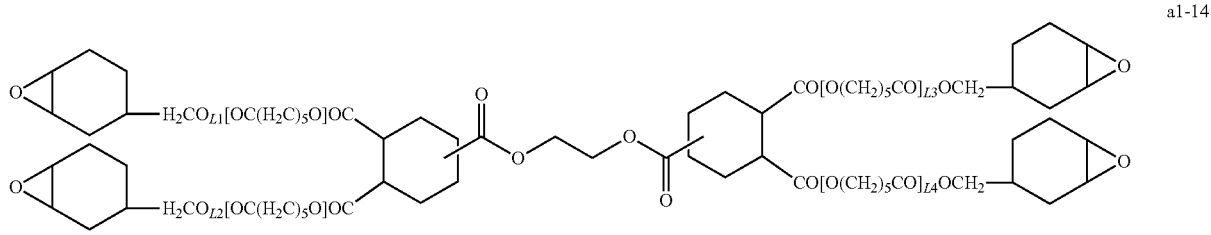

A resin having at least four cyclohexene oxide skeletons in its molecule is most favorable as the first epoxy resin (a), and examples of this resin include Resin (a1-1), Resin (a1-4) to Resin (a1-10), Resin (a1-13), and Resin (a1-14). When the resin has at least four cyclohexene oxide skeletons in its molecule, high resolution and a strong cured film are easily obtained.

The content of the first epoxy resin (a) in the photosensitive negative resin composition is favorably 1% by mass or more, more favorably 3% by mass or more, still more favorably 5% by mass or more. The content is favorably 70% by mass or less, more favorably 60% by mass or less. When the content of the first epoxy resin (a) is 1% by mass or more and 70% by mass or less, a resist layer having high sensitivity and proper hardness is easily obtained when such a photosensitive negative resin composition is applied to a substrate.

Incidentally, one kind of first epoxy resin (a) may be used by itself, or plural kinds thereof may be used in combination.

First Onium Salt (b): Onium Salt Composed of a Cation Moiety Structure Represented by Formula b1 and an Anion Moiety Structure Represented by Formula b2

The first onium salt is an onium salt composed of a cation moiety structure represented by the following formula b1 (hereinafter may also referred to as "cation moiety (b1)") and an anion moiety structure represented by the following formula b2 (hereinafter may also referred to as "anion moiety (b2)"). Since the first onium salt is a salt, it may be composed of a one-to-one combination of the cation moiety (b1) and the anion moiety (b2).

Formula b1

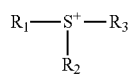

Formula b2

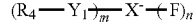

In the formula b1, $R_1$ to $R_3$ are, independently of one another, an organic group which may be substituted and has 1 to 30 carbon atoms (including carbon atoms in the substituent). However, two or more oxygen atoms are included in all atoms (all constituent atoms) constituting $R_1$ to $R_3$. When two or more oxygen atoms are contained, the absorption wavelength of the onium salt becomes long, so that photosensitivity to i-line is improved, and compatibility with a resin is improved. Ten or more oxygen atoms are favorably contained in all the constituent atoms from the viewpoint of solubility in a solvent. All of $R_1$ to $R_3$ may contain the oxygen atom. Only one or two of $R_1$ to $R_3$ may contain the oxygen atom. All of $R_1$ to $R_3$ may have one or plural cyclic structures.

Examples of the organic groups include aryl groups having 6 to 30 carbon atoms in total, heterocyclic groups having 4 to 30 carbon atoms in total, alkyl groups having 1 to 30 carbon atoms in total, alkenyl groups having 2 to 30 carbon atoms in total and alkynyl groups having 2 to 30 carbon atoms in total. Examples of the substituent that these organic groups may have include alkyl groups, a hydroxyl group, cycloalkyl groups, alkenyl groups, alkynyl groups, alkoxy groups, alkylcarbonyl groups, arylcarbonyl groups, alkoxycarbonyl groups, aryloxycarbonyl groups, arylthiocarbonyl groups, acyloxy groups, arylthio groups, alkylthio groups, aryl groups, heteroatom-containing aromatic ring groups, aryloxy groups, alkylsulfinyl groups, arylsulfinyl groups, alkylsulfonyl groups, arylsulfonyl groups, alkyleneoxy groups, amino groups, cyano groups and nitro groups, and halogen atoms. The organic groups may be substituted by one or plural substituents selected from the group consisting of these groups and halogen atoms. The organic groups may be bonded to $S^+$ in the formula b1 through these substituents. In, for example, a formula b1-17 described below, a heterocyclic group, which is the organic group, is bonded to through an arylthio group, which is the substituent.

More specifically, examples of these substituents include alkyl groups having 1 to 6 carbon atoms (for example, methyl, ethyl, propyl, isopropyl and butyl groups), a hydroxyl group, cycloalkyl groups having 3 to 6 carbon atoms (for example, cyclopropyl, cyclobutyl, cyclopentyl and cyclohexyl groups), alkenyl groups having 2 to 6 carbon atoms (for example, vinyl, 1-propenyl, 2-propenyl and 2-butenyl groups), alkynyl groups having 2 to 6 carbon atoms (for example, acetylenyl, 1-propinyl, 2-propinyl and 2-butynyl groups), alkoxy groups having 1 to 6 carbon atoms (for example, methoxy, ethoxy, n-propoxy, isopropoxy, n-butoxy and tert-butoxy groups), alkylcarbonyl groups having 2 to 6 carbon atoms, arylcarbonyl groups having 7 to 11 carbon atoms, alkoxycarbonyl groups having 2 to 6 carbon atoms (for example, methoxycarbonyl, ethoxycarbonyl and tert-butoxycarbonyl groups), aryloxycarbonyl groups having 7 to 11 carbon atoms, arylthiocarbonyl groups having 7 to 11 carbon atoms, acyloxy groups having 2 to 6 carbon atoms, arylthio groups having 6 to 10 carbon atoms (for example, phenylthio and naphthylthio groups), alkylthio groups having 1 to 6 carbon atoms (for example, methylthio, ethylthio, n-propylthio, isopropylthio, n-butylthio and tert-butylthio groups), aryl groups having 6 to 14 carbon atoms (for example, phenyl, naphthyl and anthracenyl groups), heteroatom-containing aromatic ring groups having 4 to 8 carbon atoms (for example, furyl and thienyl groups), aryloxy groups having 6 to 10 carbon atoms (for example, phenoxy and naphthoxy groups), alkylsulfinyl groups having 1 to 6 carbon atoms, arylsulfinyl groups having 6 to 10 carbon atoms, alkylsulfonyl groups having 1 to 6 carbon atoms, arylsulfonyl groups having 6 to 10 carbon atoms, alkyleneoxy groups having 1 to 6 carbon atoms, amino groups, cyano groups and nitro groups, and halogen atoms (for example, chlorine, bromine and fluorine atoms).

Incidentally, $R_1$ to $R_3$ may be the same or different from one another. $R_1$ and $R_2$, $R_2$ and $R_3$, and $R_1$ and $R_3$ may be bonded to each other directly or through a linking group to form a cyclic structure. In other words, two or more R groups (for example, $R_1$, $R_2$ and $R_3$) of $R_1$ to $R_3$ may be bonded to one another directly or through a linking group to form a cyclic structure.

As examples of the linking group, may be mentioned —O—, —S—, —SO—, —SO$_2$—, —NH—, —NR$_{31}$—, —CO—, —C(=O)O—, —C(=O) NH—, alkylene groups having 1 to 3 carbon atoms and phenylene groups. Here, $R_{31}$ is an alkyl group having 1 to 5 carbon atoms or an aryl group having 6 to 10 carbon atoms. Incidentally, when, for example, $R_1$ and $R_2$ form a cyclic structure, the number of carbon atoms in this cyclic structure becomes a total of the number of carbon atoms in $R_1$ (1 or more and 30 or less), the number of carbon atoms in $R_2$ (1 or more and 30 or less) and the number of carbon atoms in the linking group (0 when bonded through no linking group). It may be considered likewise when $R_1$ and $R_3$ or $R_2$ and $R_3$ form a cyclic structure. However, when $R_1$ and $R_2$/$R_2$ and $R_3$, or $R_1$ and $R_3$ forms a cyclic structure, the numbers of carbon atoms in these cyclic structures are each favorably controlled to 4 or more and 10 or less from the viewpoint of storage stability. Incidentally, when $R_1$, $R_2$ and $R_3$ are bonded to form a plurality of cyclic structures, the number of carbon atoms in each cyclic structure is favorably controlled to 4 or more and 10 or less.

In the formula b2, $R_4$ is a hydrocarbon group which may be substituted by a fluorine atom and has 1 to 30 carbon atoms. $R_4$ may be, for example, an alkyl or aryl group which may be substituted by a fluorine atom and has 1 to 30 carbon atoms. Incidentally, the number of carbon atoms in this hydrocarbon group is controlled to 1 or more and 30 or less from the viewpoint of sensitivity.

X is an atom selected from a carbon atom, a nitrogen atom, a phosphorus atom and a boron atom. When X is the carbon atom, n is an integer selected from 0, 1 and 2, with the proviso that a total (m+n) of m and n is 3. When X is the nitrogen atom, n is an integer selected from 0 and 1, with the proviso that a total of m and n is 2. When X is the phosphorus atom, n is an integer selected from 0 or more and 6 or less, with the proviso that a total of m and n is 6. When X is the boron atom, n is an integer selected from 0 or more and 3 or less, with the proviso that a total of m and n is 4.

$Y_1$ is a group selected from —S(=O)$_2$—, an alkylene fluoride group, -*$_2$—O—CF$_2$—, -*$_1$—C(=O)—CF$_2$—, -*$_1$—O—C(=O)—CF$_2$—, -*$_1$—C(=O)—O—CF$_2$— and a single bond. Incidentally, the number of carbon atoms in the alkylene fluoride group is favorably controlled to two or more from the viewpoint of resolution and 10 or less from the viewpoint of sensitivity. Incidentally, when $Y_1$ is -*$_2$—O—CF$_2$—, -*$_1$—C(=O)—CF$_2$—, -*$_1$—O—C(=O)—CF$_2$— or -*$_2$—C(=O)—O—CF$_2$—, *$_2$ in these groups is bonded to $R_4$. That is, *$_2$ designates an end bonded to $R_4$.

When $Y_1$ is —S(=O)$_2$— or the single bond, and n is 0 in the formula b2, $R_4$ is favorably a hydrocarbon group having at least one fluorine atom and 1 to 12 carbon atoms from the viewpoint of volatility of an acid generated from the first onium salt (b).

When m in the formula b2 is an integer of 2 or more, any carbon atom in one $R_4$—$Y_1$— group of two or more $R_4$—$Y_1$— groups bonded to X may be bonded to any carbon atom in another one $R_4$—$Y_1$— group through a single bond, thereby forming a cyclic structure.

X in the formula b2 is favorably a phosphorus atom from the viewpoint of sensitivity, and specific examples of such a structure include Anion Moiety (b2-11) to Anion Moiety (b2-18) described below. In the case of a Lewis acid system (for example, the case where X is a phosphorus atom), a cured film formed from the resulting photosensitive negative resin composition tends to have excellent heat resistance.

An exemplary combination of the cation moiety (b1) and the anion moiety (b2) constituting the first onium salt (b) is mentioned below. The feature of the cation moiety (b1) resides in that the photosensitivity to i-line is high. This feature is attributed to the result that the absorption wavelength of the first onium salt (b) can become long owing to the cation moiety (b1) having two or more oxygen atoms. On the other hand, the anion moiety (b2) generates an acid originated from this anion moiety (b2) when the first onium salt (b) is dissociated by exposure. Thereafter, a cationic polymerization reaction of an epoxy group in a resin (for example, the first epoxy resin (a)) can be started and accelerated by the action of the acid generated. From the viewpoint of achieving high toughness of a cured product, this generated acid favorably has such an acid strength that the epoxy-group-containing resin such as the first epoxy resin (a) is sufficiently cured. Such an acid strength that the epoxy group-containing resin is sufficiently cured means that this acid is a strong acid stronger than hexafluoroantimonic acid in Lewis acid, that is, that its Hammett acidity function $H_0$ is more than 18. In Brønsted acid, the acid strength means that this acid is a strong acid not lower than nanofluorobutanesulfonic acid, that is, that its PKa is −3.57 or more.

Formula b1-17
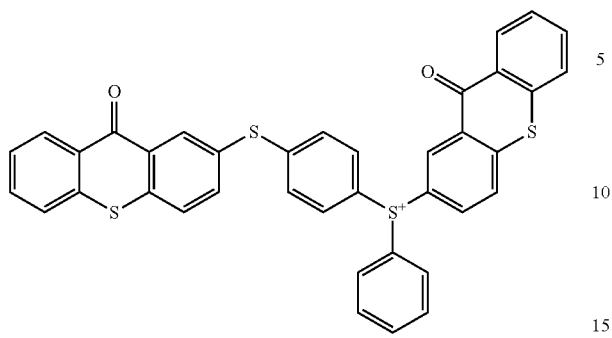
Formula b2-12
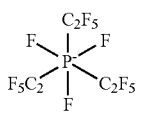
In addition, as specific examples of the cation moiety (b1), Cation Moiety (b1-1) to Cation Moiety (b1-42) respectively represented by the following formulae b1-1 to b1-42 may be mentioned.
b1-1
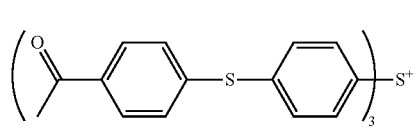
b1-2
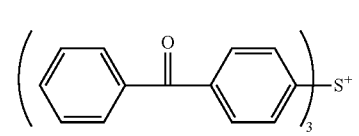
b1-3
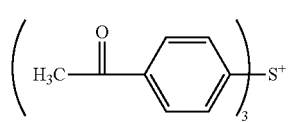
b1-4
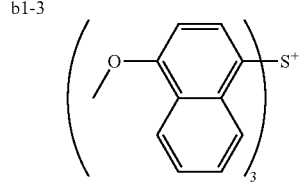
b1-5
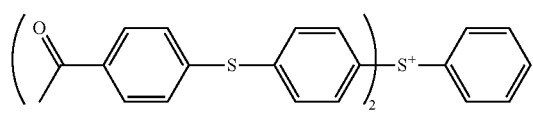
b1-6
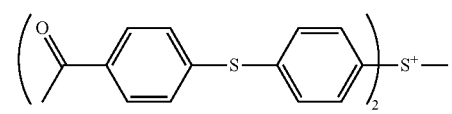
b1-7
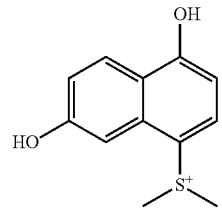
b1-8
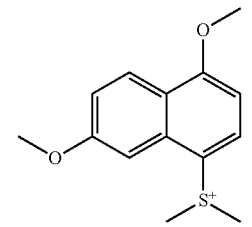
b1-9
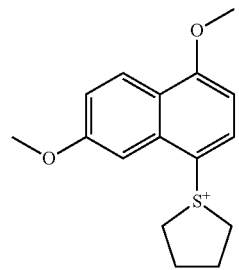
b1-10
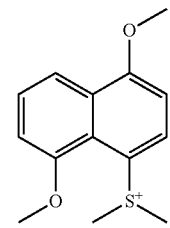
b1-11
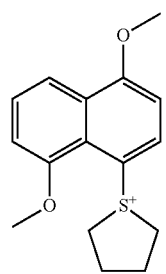
b1-12
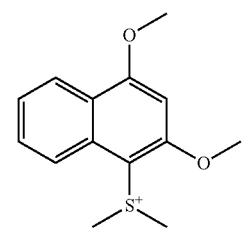

-continued
b1-13
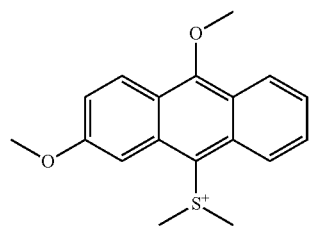
b1-14
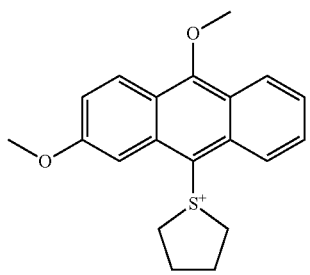
b1-15
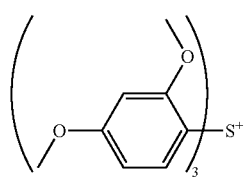
b1-16
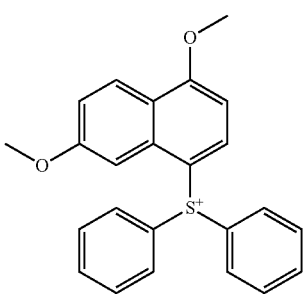
b1-17
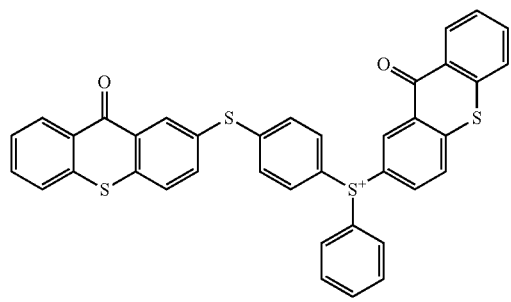
b1-18
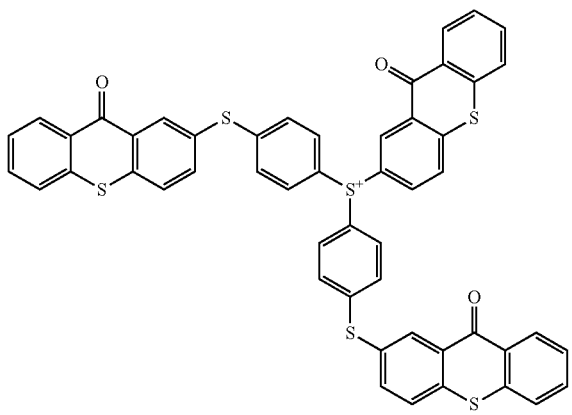
b1-19
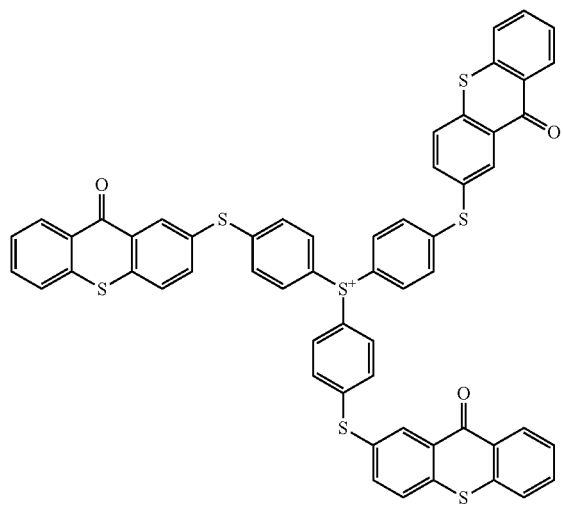
b1-20
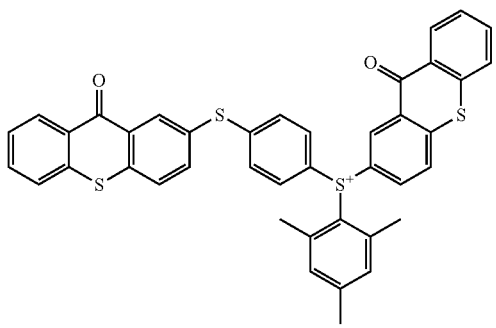

-continued
b1-21
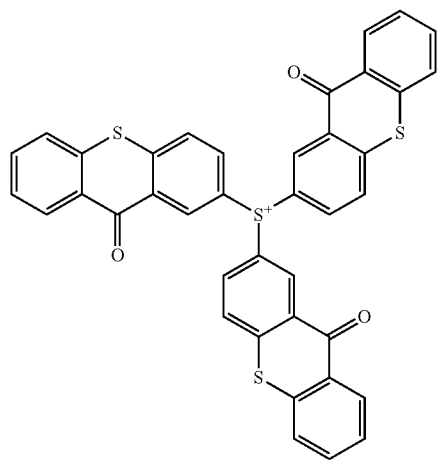
b-22
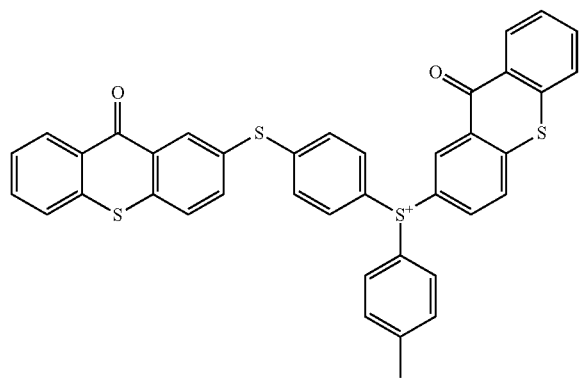
b1-23
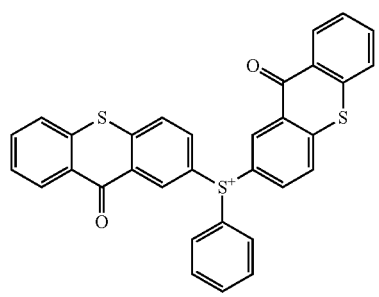
b1-24
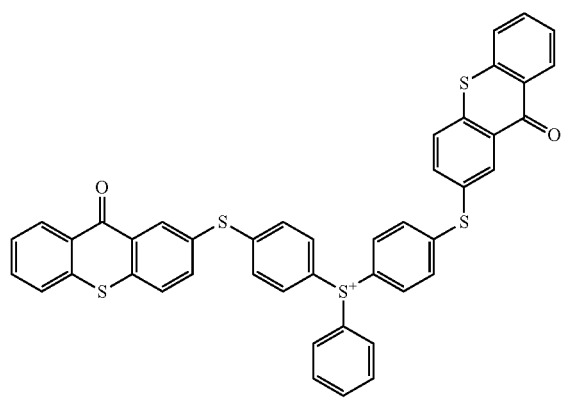
b1-25
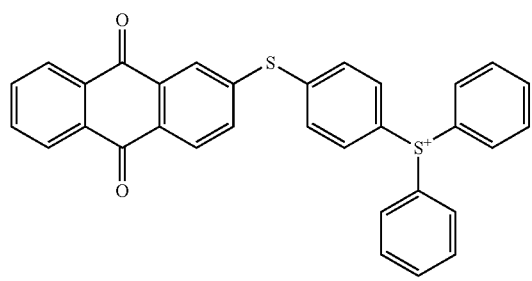
b1-26
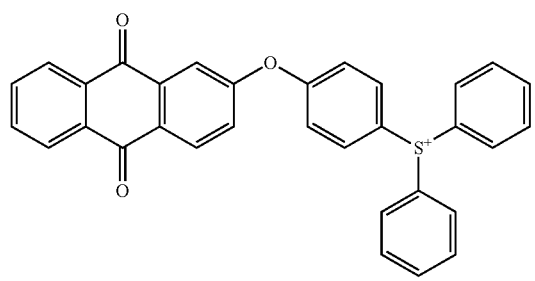
b1-27
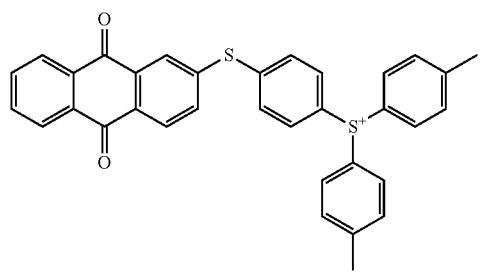
b1-28
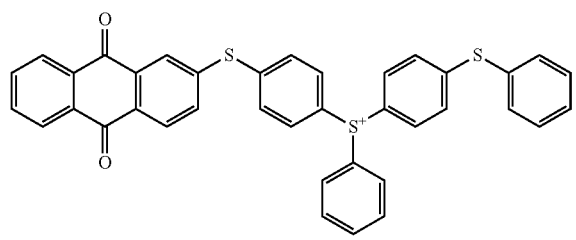

-continued
b1-29
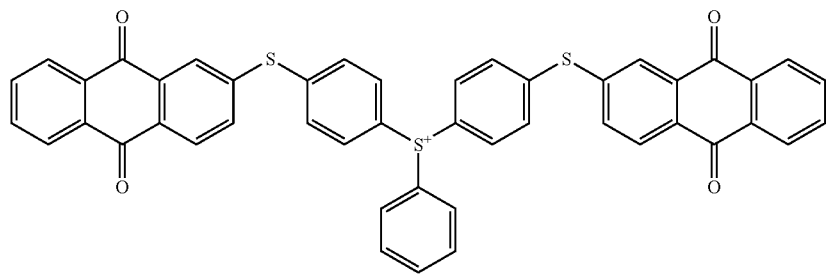
b1-30
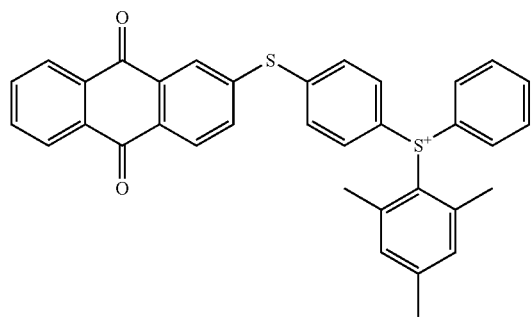
b1-31
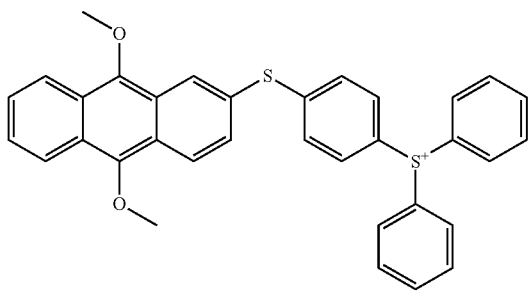
b1-32
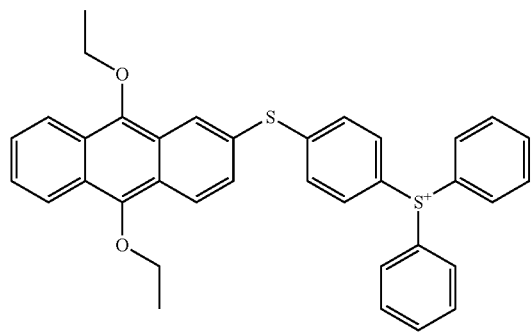
b1-33
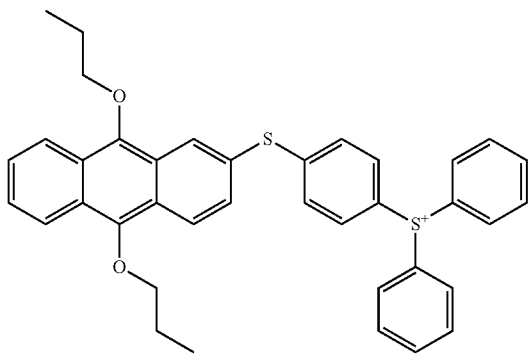
b1-34
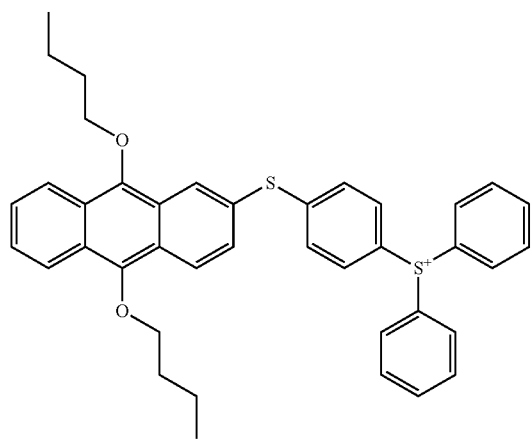
b1-35
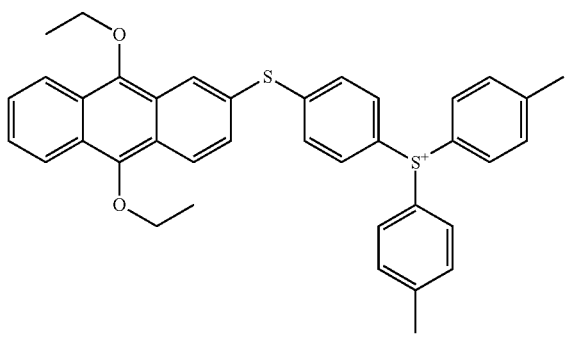

-continued b1-36
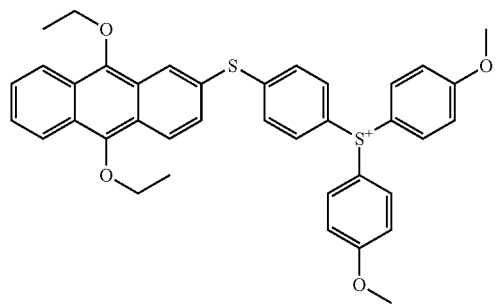

b1-37
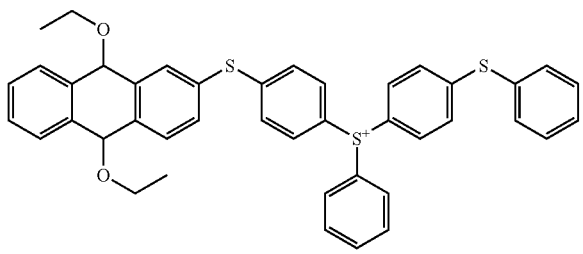

b1-38
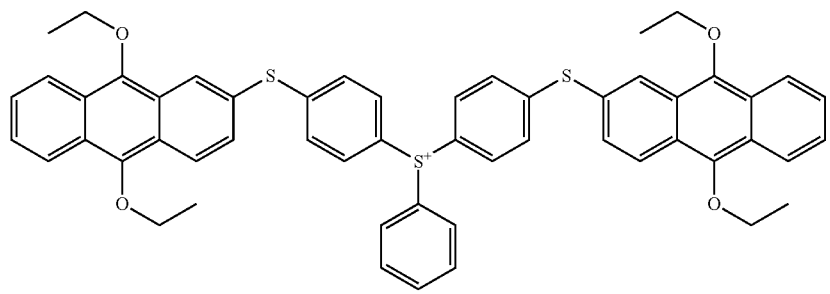

b1-39
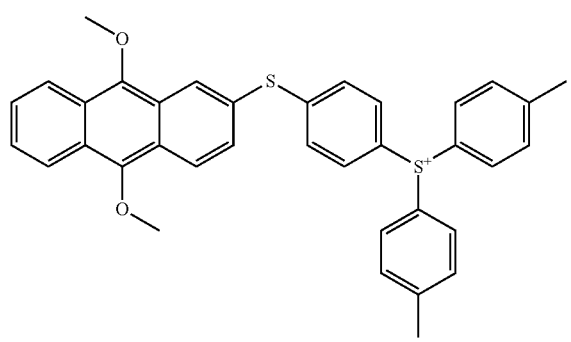

b1-40
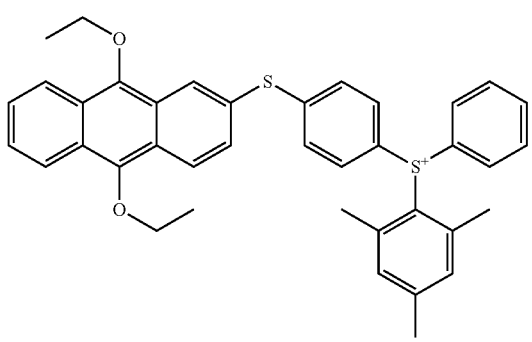

b1-41
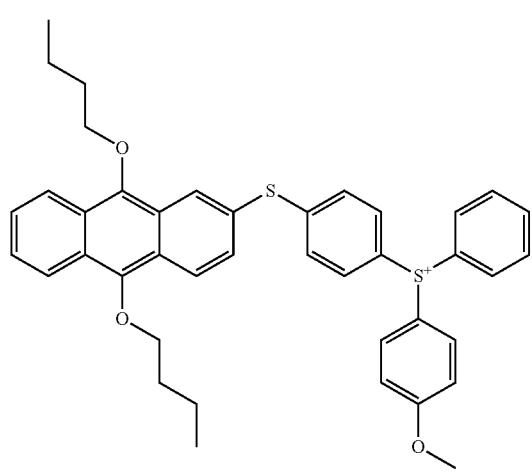

b1-42
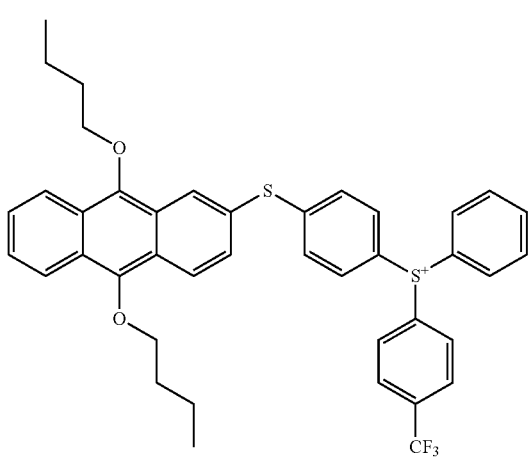

Among these, a cation moiety (b1) containing a cyclic carbonyl structure is favorable from the viewpoint of high photosensitivity to i-line. As examples of the cation moiety (b1) containing this cyclic carbonyl structure, Cation Moiety (b1-17) to Cation Moiety (b1-30) may be mentioned. In addition, from the viewpoint of the long absorption wavelength, the cation moiety (b1) more favorably contains a heterocyclic group containing the cyclic carbonyl structure. As specific examples of the cation moiety (b1) containing this heterocyclic group containing the cyclic carbonyl structure, are mentioned the above-mentioned Cation Moiety (b1-17) to Cation Moiety (b1-24). Further, from the viewpoint of the long absorption wavelength, at least one of $R_1$ to $R_3$ in the formula b1 favorably contains the cyclic carbonyl structure, and two or more of $R_1$ to $R_3$ more favorably contain the cyclic carbonyl structure. The carbonyl group in the cyclic carbonyl structure is particularly favorably present in a conjugated system. When the carbonyl group is present in a conjugated system, such a structure can greatly contribute to the long absorption wavelength of the first onium salt (b). In particular, the conjugated system contains an aromatic ring, whereby the photosensitivity to i-line can be more improved.

As specific examples of the anion moiety (b2), Anion Moiety (b2-1) to Anion Moiety (b2-22) respectively represented by the following formulae b2-1 to b2-22 may be mentioned.

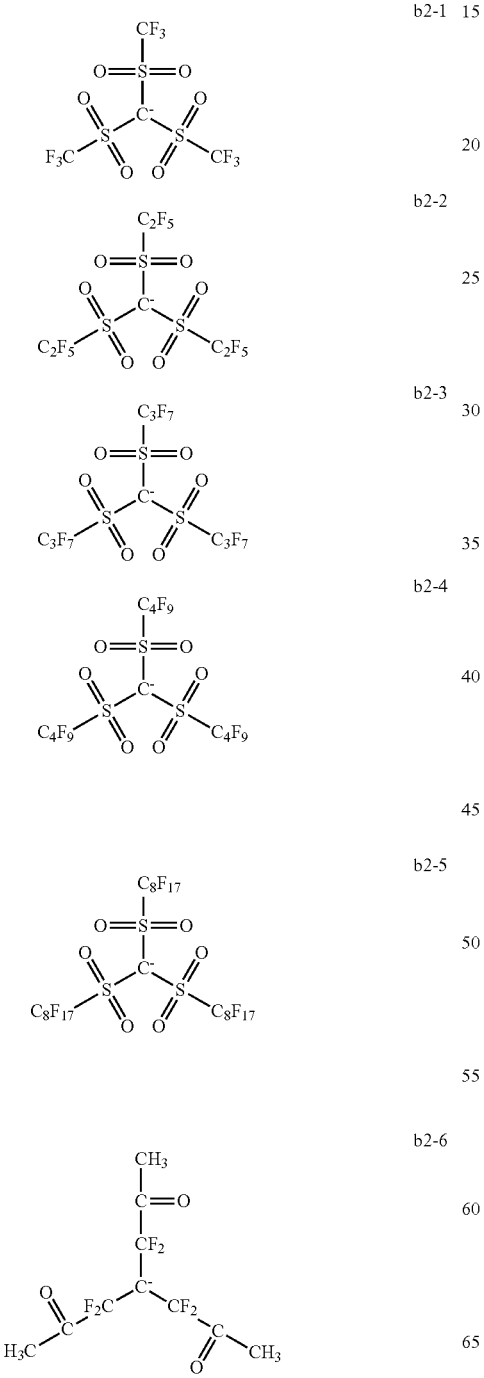

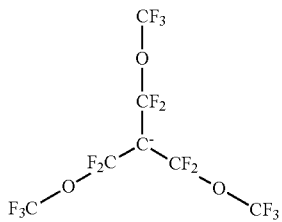

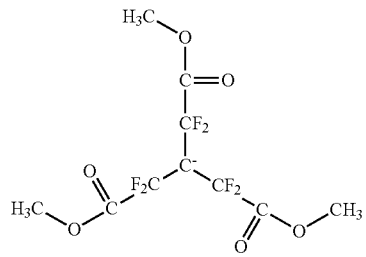

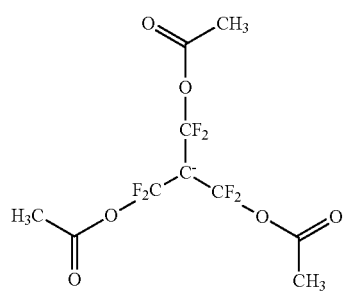

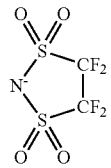

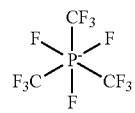

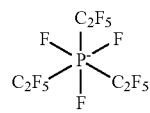

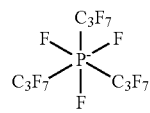

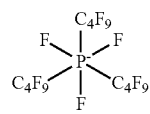

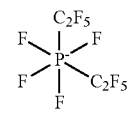

b2-16 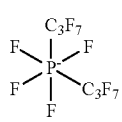

b2-17 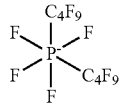

b2-18 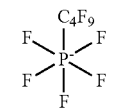

b2-19 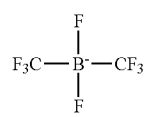

b2-20 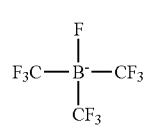

b2-21 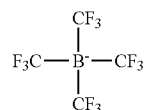

b2-22 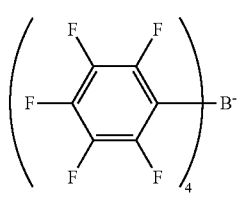

One kind of first onium salt (b) may be used by itself, or plural kinds thereof may be used in combination. The content of the first onium salt (b) in the photosensitive negative resin composition is favorably 0.01% by mass or more, more favorably 0.1% by mass or more from the viewpoint of sensitivity. The content of the first onium salt (b) is favorably 70% by mass or less, more favorably 65% by mass or less from the viewpoint of development residue. The content of the first onium salt (b) is furthermore favorably 50% by mass or less, 30% by mass or less, or 20% by mass or less, which are increasingly favorable in the stated order.

Silane Compound (c)

No particular limitation is imposed on the silane compound (c) so far as it is a compound containing a silicon atom. However, the silane compound is favorably an organosilane compound having a function of improving or assisting the adhesion of a resulting photosensitive negative resin composition to a substrate. Examples of this organosilane compound include organosilane compounds having an epoxy group, such as γ-glycidoxypropyltrimethoxysilane, γ-glycidoxypropylmethyldimethoxysilane, γ-glycidoxypropyltriethoxysilane and β-(3,4-epoxycyclohexyl)ethyltrimethoxysilane; organosilane compounds having an amino group, such as N-β(aminoethyl)-γ-aminopropyltrimethoxysilane, N-β(aminoethyl)-γ-aminopropyltriethoxysilane, N-β(aminoethyl)-3-aminopropylmethyldimethoxysilane, γ-aminopropyltrimethoxysilane, γ-aminopropyltriethoxysilane, N-phenyl-γ-aminopropyltrimethoxysilane, N-phenyl-γ-aminopropyltriethoxysilane, γ-triethoxysilyl-N-(1,3-dimethylbutylidene)propylamine and N-(vinylbenzyl)-β-aminoethyl-γ-aminopropyltrimethoxysilane; organosilane compounds having an isocyanate group, such as 3-isocyanatopropyltrimethoxysilane and 3-isocyanatopropyltriethoxysilane; and organosilane compounds having a mercapto group, such as γ-mercaptopropyltrimethoxysilane, γ-mercaptopropylmethyldimethoxysilane and γ-mercaptopropyltriethoxysilane.

An organosilane compound having an epoxy group is favorably used as the silane compound (c) from the viewpoint of the adhesion of an inorganic substance to an epoxy resin film. As the silane compound having the epoxy group, for example, trade name: SILQUEST A-187 SILANE (product of Momentive Performance Materials Japan, Inc.) is available as a commercially available product and particularly favorably used.

The content of the silane compound (c) in the photosensitive negative resin composition is favorably 0.1% by mass or more, more favorably 0.5% by mass or more, from the viewpoint of the adhesion. In addition, the content of the silane compound (c) is favorably 20% by mass or less, more favorably 15% by mass or less, from the viewpoint of achieving high toughness of a cured product.

Incidentally, one kind of silane compound (c) may be used by itself, or plural kinds thereof may be used in combination.

Organic Solvent (d)

No particular limitation is imposed on the organic solvent (d). However, the organic solvent is favorably a solvent capable of dissolving the respective components (the first epoxy resin (a), the first onium salt (b) and the silane compound (c)). Examples thereof include organic solvents such as alkylene glycol monoalkyl ether carboxylates, alkylene glycol monoalkyl ethers, alkyl lactates, alkyl alkoxypropionates, cyclic lactones (favorably, having 4 to 10 carbon atoms), monoketone compounds (favorably, having 4 to 10 carbon atoms) which may contain a ring, alkylene carbonates, alkoxyalkyl acetates, alkyl pyruvates and compounds having a benzene ring.

Favorable examples of the alkylene glycol monoalkyl ether carboxylates include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Favorable examples of the alkylene glycol monoalkyl ethers include propylene glycol monomethyl ether, propylene glycol monoethyl ether, propylene glycol monopropyl ether, propylene glycol monombutyl ether, ethylene glycol monomethyl ether and ethylene glycol monoethyl ether.

Favorable examples of the alkyl lactates include methyl lactate, ethyl lactate, propyl lactate and butyl lactate.

Favorable examples of the alkyl alkoxypropionates include ethyl 3-ethoxypropionate, methyl 3-methoxypropionate, methyl 3-ethoxypropionate and ethyl 3-methoxypropionate.

Favorable examples of the cyclic lactones include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Favorable examples of the monoketone compounds which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4- dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Favorable examples of the alkylene carbonates include propylene carbonate, vinylene carbonate, ethylene carbonate and butylene carbonate.

Favorable examples of the alkoxyalkyl acetates include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Favorable examples of the alkyl pyruvates include methyl pyruvate, ethyl pyruvate and propyl pyruvate.

Favorable examples of the compounds having a benzene ring include benzene, toluene, ethylbenzene, ortho-xylene, meta-xylene and para-xylene. When written as xylene, such xylene may be a mixture of ortho-xylene, meta-xylene, para-xylene and ethylbenzene.

As the organic solvent (d), may be favorably used a solvent having a boiling point of 110° C. or more under ordinary temperature (25° C.) and ordinary pressure ($10^5$ Pa). Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, propylene carbonate and xylene. In the present invention, the above-described solvents may be used either singly or in any combination thereof.

The content of the organic solvent (d) in the photosensitive negative resin composition is favorably 5% by mass or more, more favorably 10% by mass or more. In addition, the content is favorably 99.55 by mass or less, more favorably 99.0% by mass or less. The content is furthermore favorably 70% by mass or less, 60% by mass or less, or 20% by mass or less, which are increasingly favorable in the stated order. The content of the organic solvent (d) is controlled to 5% by mass or more and 99.5% by mass or less, whereby a resist layer having a good coating surface form can be easily obtained when a resulting photosensitive negative resin composition is applied to a support (substrate).

The photosensitive negative resin composition according to the present invention may be composed of the first epoxy resin (a), the first onium salt (b), the silane compound (c) and the organic solvent (d), as described above. However, not limited to only these components, for example, a second epoxy resin (e), a second onium salt (f), a third onium salt (g) and a third epoxy resin (h) may also be suitably used in the photosensitive negative resin composition.

Second Epoxy Resin (e): Epoxy Resin Containing an Alicyclic Group Different from the Cyclohexene Oxide Skeleton and Having a Softening Point of 70° C. or More No particular limitation is imposed on the second epoxy resin (e) so far as the epoxy resin contains an alicyclic group different from the cyclohexene oxide skeleton and has a softening point of 70° C. or more. Incidentally, as example of the alicyclic group different from the cyclohexene oxide skeleton, a 3-glycidylcyclohexyl group may be mentioned.

The second epoxy resin (e) is favorably a polyfunctional epoxy resin compound having an epoxy group in an amount sufficient to form a thick-film pattern in a molecule thereof and containing an alicyclic group different from the cyclohexene oxide skeleton. Examples of such a polyfunctional epoxy resin include polyfunctional alicyclic type epoxy resins, polyfunctional aromatic epoxy resins and hydrogenated epoxy resins obtained by hydrogenating the polyfunctional aromatic epoxy resins. Examples of the polyfunctional aromatic epoxy resins include polyfunctional phenol/novolak type epoxy resins, polyfunctional ortho-cresol novolak type epoxy resins, polyfunctional triphenyl novolak type epoxy resins, polyfunctional bisphenol A novolak type epoxy resins, polyfunctional bisphenol F novolak type epoxy resins, polyfunctional bisphenol A type epoxy resins and polyfunctional bisphenol F type epoxy resins. As the polyfunctional alicyclic epoxy resin among these, for example, trade name: EHPE 3150 (product of Daicel Corporation) is available as a commercially available product and particularly favorably used. As the hydrogenated epoxy resin, trade name: ST-4000D (product of Nippon Steel Chemical Co., Ltd.) is available as a commercially available product and particularly favorably used.

No particular limitation is imposed on the softening point of the second epoxy resin (e) so far as it is 70° C. or more. However, the softening point is favorably 180° C. or less, more favorably 160° C. or less. When the softening point is 70° C. or more, a high-definition pattern can be easily formed. When the softening point is 180° C. or less, a cured product that has a small amount of unreacted epoxy group and is sufficiently three-dimensionally crosslinked is easily obtained.

The ring and ball method can be used for the measurement of the softening point. One may refer to JIS K 5902 (Rosin) and JIS K 2207 (Petroleum Asphalt) for the ring and ball method. In addition, a commercially available automatic measuring device conformable to the standard thereof may be used.

The content of the second epoxy resin (e) in the photosensitive negative resin composition is favorably 0.02% by mass or more, more favorably 0.2% by mass or more. In addition, the content is favorably 80% by mass or less, more favorably 70% by mass or less. When the content of the second epoxy resin (e) is 0.02% by mass or more and 80% by mass or less, a resist layer having high resolution and proper hardness is easily obtained when such a photosensitive negative resin composition is applied to a support.

Incidentally, one kind of second epoxy resin (e) may be used by itself, or plural kinds thereof may be used in combination.

Second onium salt (f): Onium salt composed of a cation moiety structure represented by Formula f1 and an anion moiety structure represented by Formula f2 The second onium salt (f) is composed of a cation moiety structure represented by a formula f1 (hereinafter may also referred to as "cation moiety (f1)") and an anion moiety structure represented by a formula f2 (hereinafter may also referred to as "anion moiety (f2)"), said structures being particular structures. The second onium salt (f) may be composed of a one-to-one combination of the cation moiety (f1) and the anion moiety (f2).

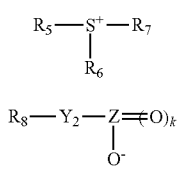

Formula f1

Formula f2

In the formula f1, $R_5$ to $R_7$ are, independently of one another, an organic group which may be substituted and has 1 to 15 carbon atoms. In addition, each of $R_5$ to $R_7$ may contain one or more cyclic structures. As examples of this organic group, may be mentioned aryl groups having 6 to 15 carbon atoms in total and alkyl groups having 1 to 15 carbon atoms in total. Examples of the substituent that these organic groups may have include alkyl groups, fluoroalkyl groups, a hydroxyl group, cycloalkyl groups, alkoxy groups, alkylcarbonyl groups, arylcarbonyl groups, arylthio groups, alkylthio groups, aryl groups and aryloxy groups, and halogen atoms. The organic groups may be substituted by one or plural substituents selected from the group consisting of these respective groups and halogen atoms. The organic groups may be bonded to $S^+$ in the formula f1 through these substituents.

More specifically, examples of these substituents include alkyl groups having 1 to 6 carbon atoms (for example, methyl, ethyl, propyl, isopropyl and butyl groups), fluoroalkyl groups having 1 to 6 carbon atoms (for example, trifluoromethyl and pentafluoroethyl groups), a hydroxyl group, cycloalkyl groups having 3 to 6 carbon atoms (for example, cyclopropyl, cyclobutyl, cyclopentyl and cyclohexyl groups), alkoxy groups having 1 to 6 carbon atoms (for example, methoxy, ethoxy, n-propoxy, isopropoxy, n-butoxy and tert-butoxy groups), alkylcarbonyl groups having 2 to 6 carbon atoms, arylcarbonyl groups having 7 to 11 carbon atoms, arylthio groups having 6 to 10 carbon atoms (for example, phenylthio and naphthylthio groups), alkylthio groups having 1 to 6 carbon atoms (for example, methylthio, ethylthio, n-propylthio, isopropylthio, n-butylthio and tert-butylthio groups), aryl groups having 6 to 10 carbon atoms (for example, phenyl and naphthyl groups) and aryloxy groups having 6 to 10 carbon atoms (for example, phenoxy and naphthoxy groups), and halogen atoms (for example, chlorine, bromine and fluorine atoms).

$R_5$ to $R_7$ may be the same or different from one another. $R_5$ and $R_6$, $R_6$ and $R_7$, and $R_5$ and $R_7$ may be bonded to each other directly or through a linking group to form a cyclic structure. That is, two or more R groups (for example, $R_5$, $R_6$ and $R_7$) of $R_5$ to $R_7$ may be bonded to one another directly or through a linking group to form a cyclic structure (ring structure). Incidentally, the number of carbon atoms in this cyclic structure can be calculated in the same manner as in $R_1$ to $R_3$ as described above. When $R_5$ and $R_6$, $R_6$ and $R_7$, or $R_5$ and $R_7$ forms a cyclic structure, the numbers of carbon atoms in these cyclic structures are each favorably controlled to 4 or more and 10 or less from the viewpoint of storage stability. When $R_5$, $R_6$ and $R_7$ are bonded to form a plurality of cyclic structures, the number of carbon atoms in each cyclic structure is favorably controlled to 4 or more and 10 or less. Examples of this linking group include —O—, —S—, —SO—, —SO$_2$—, —NH—, —NR$_{32}$—, —CO—, —C(=O)O—, —C(=O)NH—, alkylene groups having 1 to 3 carbon atoms and phenylene groups. Here, $R_{32}$ is an alkyl group having 1 to 10 carbon atoms or an aryl group having 6 to 10 carbon atoms.

In the formula f2, $R_8$ is a hydrocarbon group which may contain a heteroatom and has 1 to 20 carbon atoms. The number of carbon atoms in this hydrocarbon group is controlled to 1 or more and 20 or less from the viewpoint of control of thermal diffusion property of an acid generated from the resulting second onium salt (f). This hydrocarbon group may be, for example, a linear, branched or cyclic saturated hydrocarbon group or a linear, branched or cyclic unsaturated hydrocarbon group. Incidentally, $R_8$ may have one (monocyclic) or more (polycyclic) cyclic structures. Specifically, this hydrocarbon group may be for example, an alkyl group having 1 to 20 carbon atoms in total or an aryl group having 6 to 20 carbon atoms in total. As examples of the heteroatom, nitrogen, oxygen, sulfur, fluorine, chlorine and bromine atoms may be mentioned.

In addition, this hydrocarbon group may be substituted by, for example, one or more substituents selected from the group consisting of alkyl groups, an oxo group, cycloalkyl groups, alkoxy groups and alkylcarbonyl groups. This hydrocarbon group may be bonded to $Y_2$ in the formula f2 through these substituents.

More specifically, examples of these substituents include alkyl groups having 1 to 10 carbon atoms (for example, methyl, ethyl, propyl, isopropyl and butyl groups), cycloalkyl groups having 3 to 6 carbon atoms (for example, cyclopropyl, cyclobutyl, cyclopentyl and cyclohexyl groups), alkoxy groups having 1 to 6 carbon atoms (for example, methoxy, ethoxy, n-propoxy, isopropoxy, n-butoxy and tert-butoxy groups and alkylcarbonyl groups having 2 to 6 carbon atoms. Incidentally, the number of carbon atoms in this substituent is included in the number (1 to 20) of carbon atoms in the hydrocarbon group.

$Y_2$ is a methylene group, —CH$_2$—C(=O)—*$_2$, —CH$_2$—C(=O)—O—*$_2$, —CH$_2$—O—CF$_2$—*$_2$, —CH$_2$—C(=O)—CF$_2$—*$_2$, —CH$_2$—O—C(=O)—CF$_2$—*$_2$, —CH$_2$—C(=O)—O—CF$_2$—*$_2$ or a single bond, where *$_2$ designates an end bonded to $R_8$. Z is an atom selected from carbon and sulfur atoms. However, k is 1 when Z is the carbon atoms or is 2 when Z is the sulfur atom. Z is favorably a sulfur atom. When Z is the sulfur atom, an anion can be more stabilized compared with the case where Z is the carbon atom. Therefore, the nucleophilicity of the anion moiety (f2) can be suppressed to surely inhibit the decomposition of the second onium salt (f) due to the anion moiety (f2) that nucleophilically attacks the cation moiety (f1).

As described above, the first onium salt (b) used in the present invention can generate an acid originated from the anion moiety (b2) after exposure, and this acid is a strong acid, so that the cationic polymerization reaction of the epoxy group in the resin can be started and accelerated, and so the first onium salt is suitable for the exposure. In addition, the second onium salt (f) is used in the present invention, whereby it can be surely prevented to cure even an unexposed portion by the acid that is generated from the first onium salt (b) after the exposure and diffuses into the photosensitive negative resin composition, so that the lowering of resolution can be more surely prevented. Supposing an acid with a proton provided to the anion moiety (f2), this acid has a structure of a weak acid that cannot cause epoxy polymerization or has a very low acidity for causing the polymerization. Accordingly, when the acid generated from the first onium salt (b) and originated from the anion moiety (b2) meets the second onium salt (f), salt exchange occurs, and this acid is converted to a weak acid that cannot cause epoxy polymerization or is hard to cause the polymerization. That is, the second onium salt (f) can function as a good quencher for the acid accelerating the epoxy polymerization in the epoxy polymerization. As a result, when the second onium salt (f) is used, development contrast can be more improved, and a pattern higher in resolution can be obtained. Incidentally, one kind of second onium salt (f) may be used by itself, or plural kinds thereof may be used in combination.

An exemplary combination of the cation moiety (f1) and the anion moiety (f2) constituting the second onium salt is mentioned below.

Formula f1-1

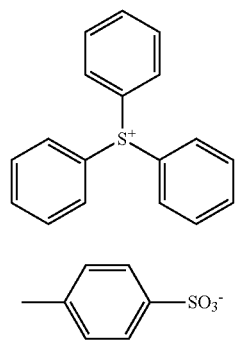

Formula f2-1

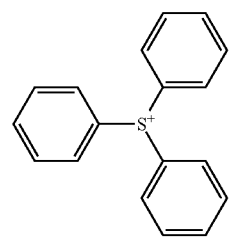

As favorable specific examples of the cation moiety (f1), Cation Moiety (f1-1) to Cation Moiety (f1-20) respectively represented by the following formulae f1-1 to f1-20 may be then mentioned.

f1-1

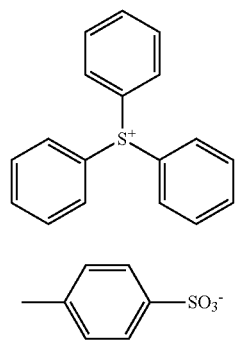

f1-2

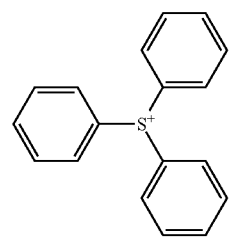

f1-3

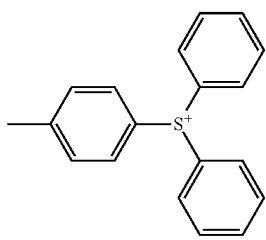

f1-4

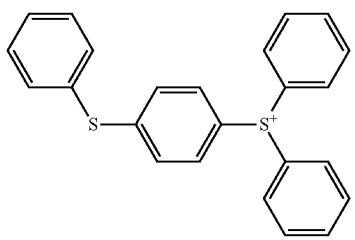

f1-5

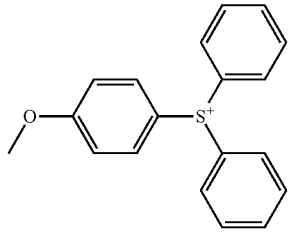

f1-6

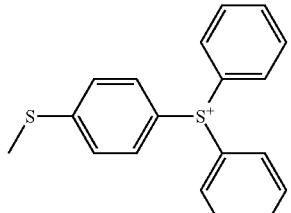

f1-7

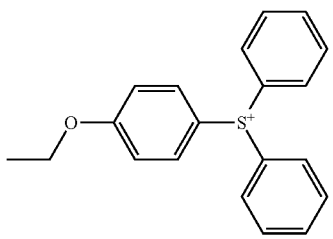

f1-8

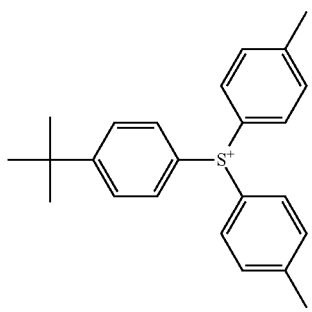

f1-9

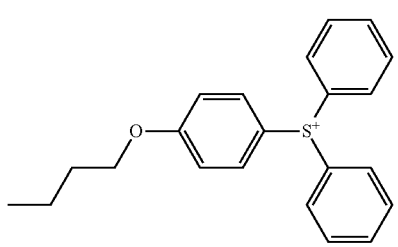

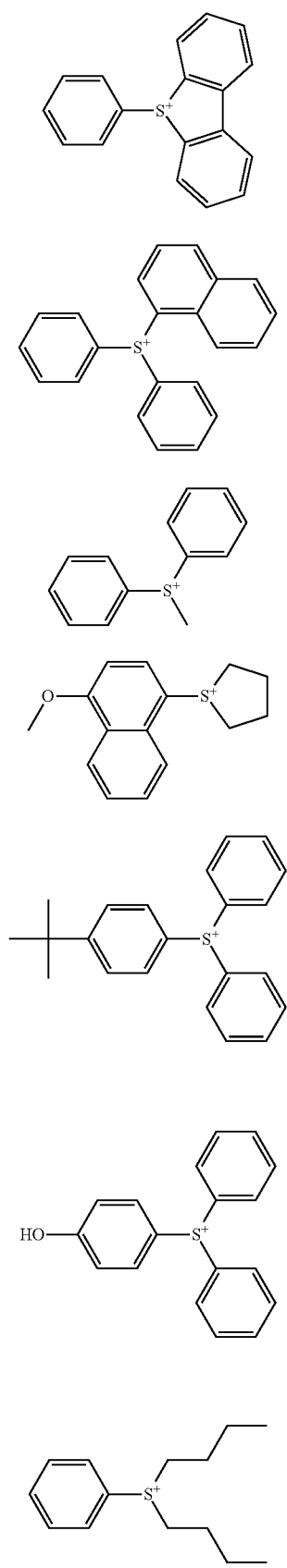
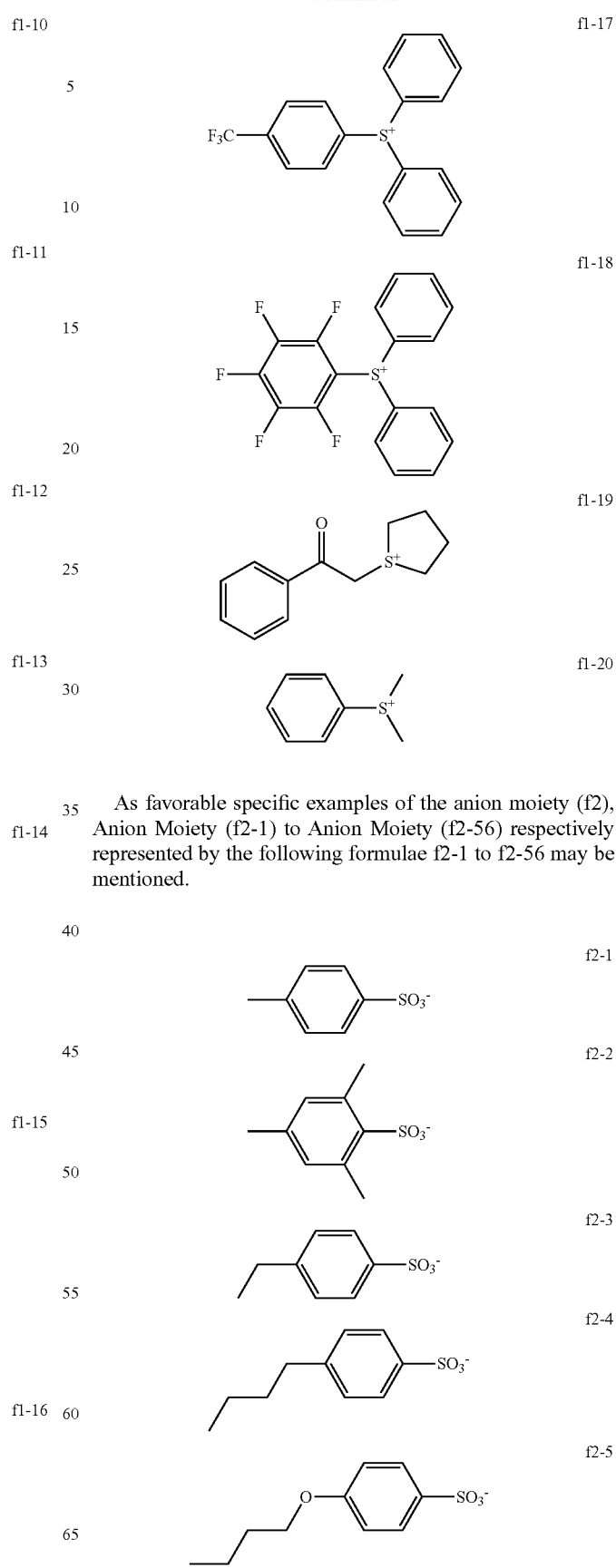
As favorable specific examples of the anion moiety (f2), Anion Moiety (f2-1) to Anion Moiety (f2-56) respectively represented by the following formulae f2-1 to f2-56 may be mentioned.

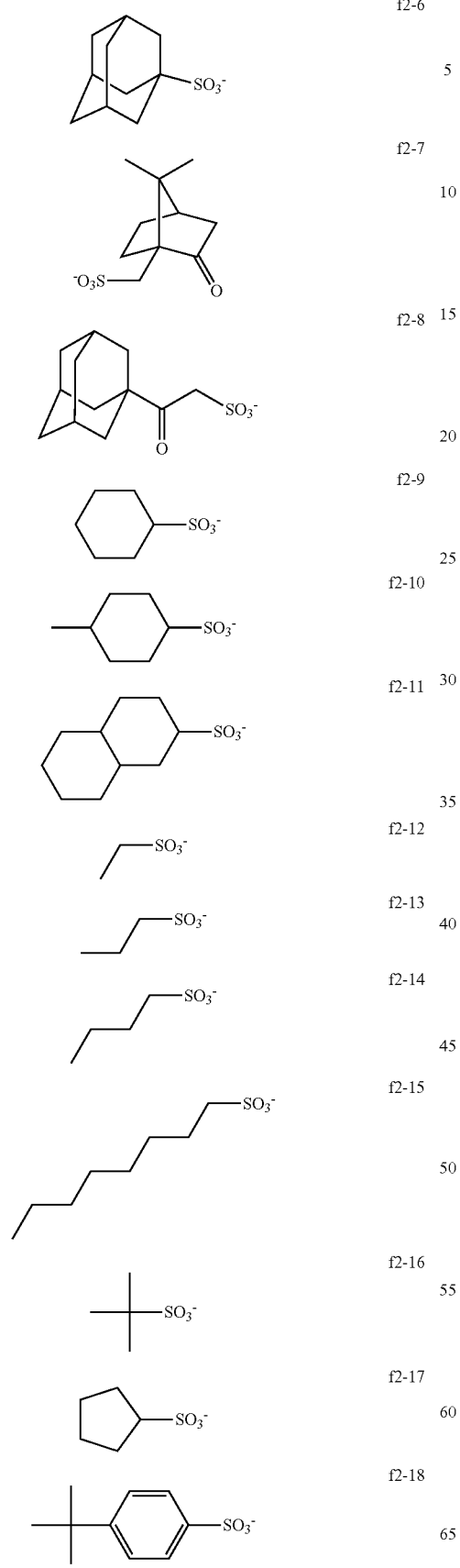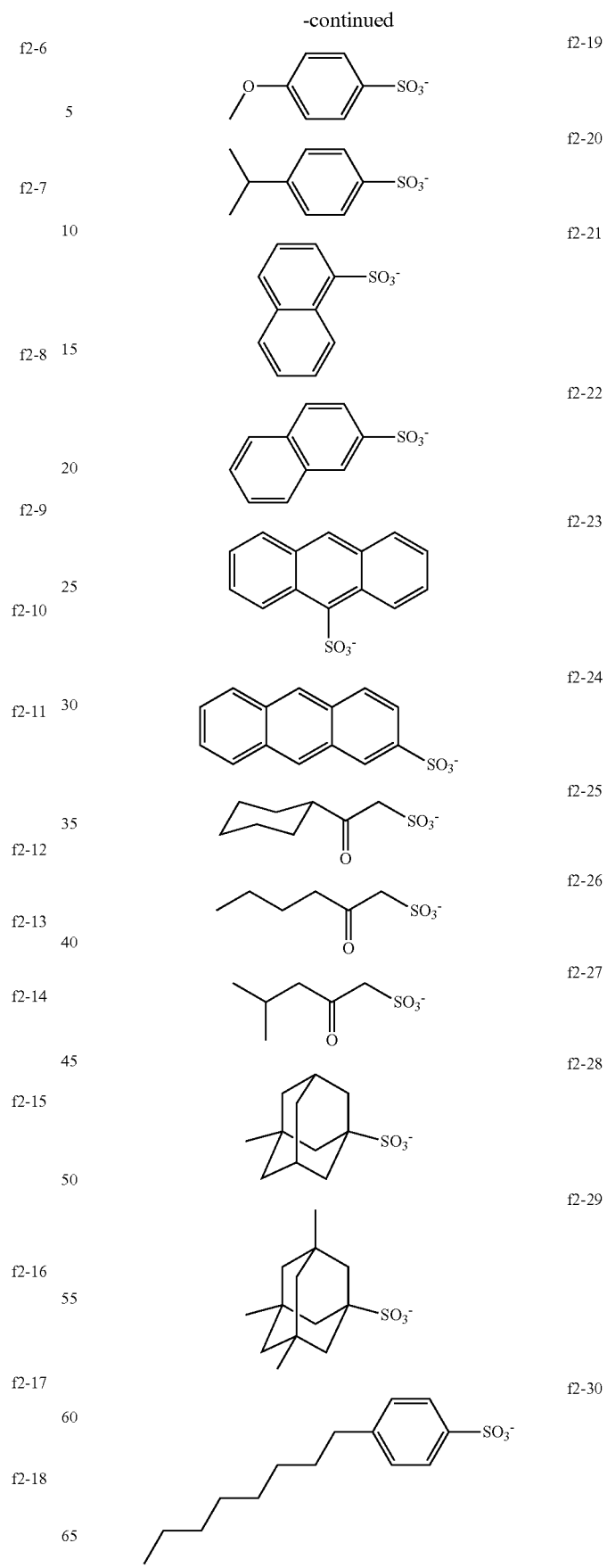

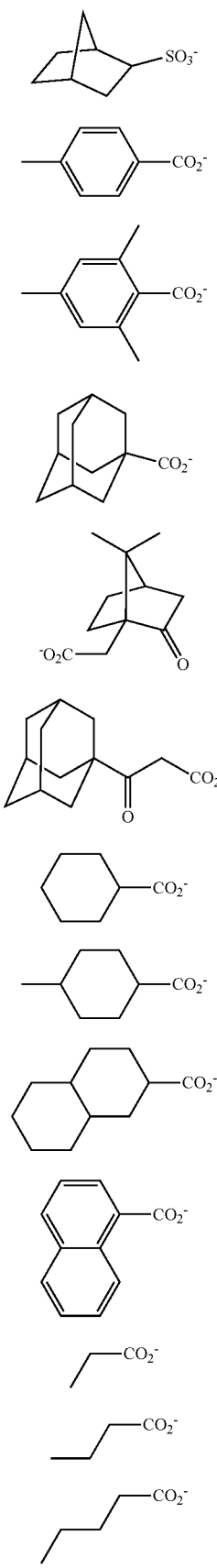
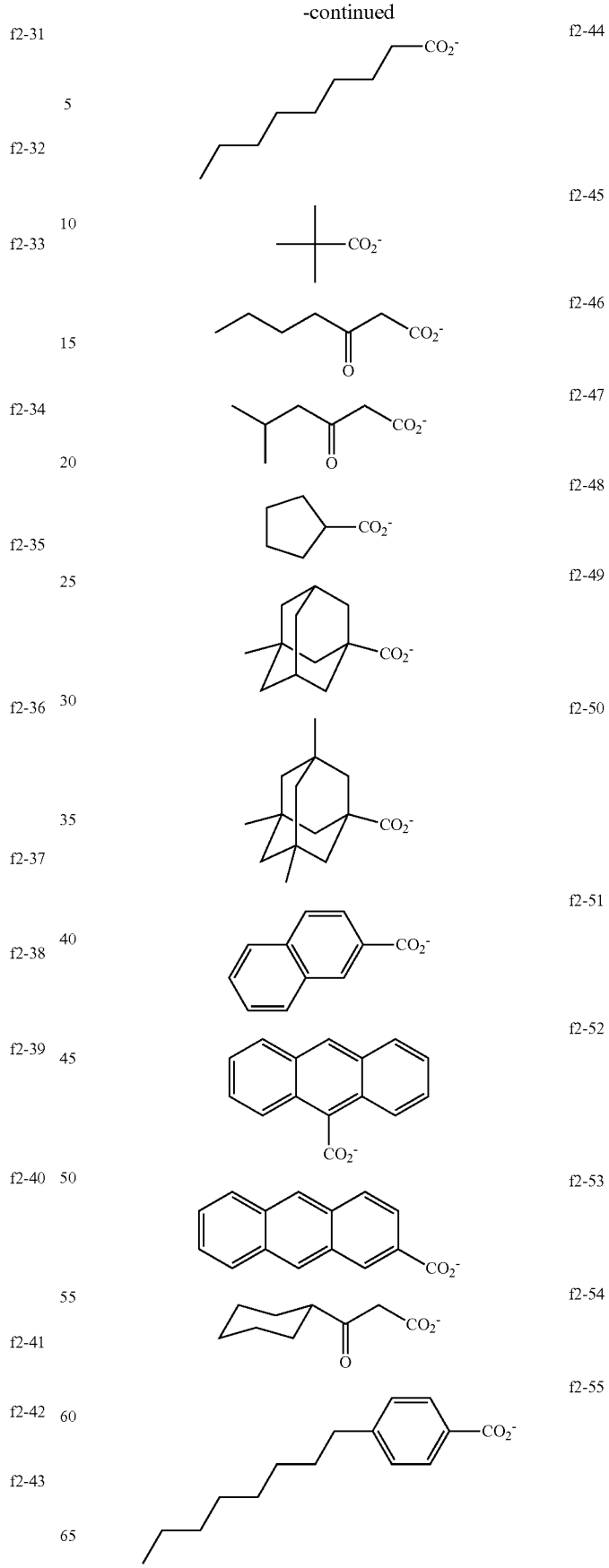

f2-56

The anion moiety (f2) is favorably a structure containing one or both of the aromatic hydrocarbon group and the alicyclic hydrocarbon group, that is, it is favorable that $R_8$ is a group containing one or both of the aromatic hydrocarbon group and the alicyclic hydrocarbon group. When the anion moiety is a structure containing one or both of the aromatic hydrocarbon group and the alicyclic hydrocarbon group, it can be surely inhibited owing to its bulkiness and carbon density that an acid generated from the anion moiety (f2) is volatilized during a heating process and vaporized off in an atmosphere. Specific examples of the anion moiety having $R_8$ containing one or both of the aromatic hydrocarbon group and the alicyclic hydrocarbon group include the above-mentioned Anion Moiety (f2-1) to Anion Moiety (f2-11), Anion Moiety (f2-17) to Anion Moiety (f2-25), Anion Moiety (f2-28) to Anion Moiety (f2-40), and Anion Moiety (f2-48) to Anion Moiety (f2-56).

The content of the second onium salt (f) in the photosensitive negative resin composition is favorably 0.001% by mass or more from the viewpoint of the controllability of the strong acid generated from the first onium salt (b). In addition, the content of the second onium salt (f) is favorably 5% by mass or less, more favorably 4% by mass or less, from the viewpoint of sensitivity.

The amounts of the first onium salt (b) and the second onium salt (f) incorporated into the photosensitive negative resin composition favorably satisfy the following relationship.

Moles of the first onium salt (b)>Moles of the second onium salt (f).

When this relationship is satisfied, such a state that the amount of the first onium salt (b) generating the acid effective for the epoxy polymerization is more than the second onium salt (f) functioning as the quencher is created, whereby high photosensitization can be easily achieved.

Third onium salt (g): Third onium salt composed of a cation moiety structure represented by Formula g1 and an anion moiety structure represented by Formula g2 The third onium salt (g) is composed of a cation moiety structure represented by the following formula g1 (hereinafter may also referred to as "cation moiety (g1)") and an anion moiety structure represented by the following formula g2 (hereinafter may also referred to as "anion moiety (g2)"). This onium salt (g) may be composed of a one-to-one combination of the cation moiety (g1) and the anion moiety (g2).

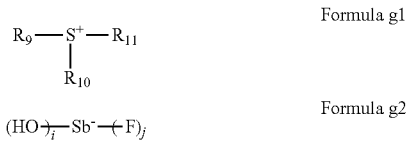

Formula g1

Formula g2

In the formula g1, $R_9$ to $R_{11}$ are, independently of one another, an organic group which may be substituted and has 1 to 30 carbon atoms (including the number of carbon atoms in the substituent). i is an integer selected from 0 or more and 6 or less, with the proviso that a total (i+j) of i and j is 6. Each of $R_9$ to $R_{11}$ may contain one or more cyclic structures.

Examples of the organic group include aryl groups having 6 to 30 carbon atoms in total, heterocyclic groups having 4 to 30 carbon atoms in total, alkyl groups having 1 to 30 carbon atoms in total, alkenyl groups having 2 to 30 carbon atoms in total and alkynyl groups having 2 to 30 carbon atoms. Examples of substituents that these organic groups may have include alkyl groups, a hydroxyl group, cycloalkyl groups, alkenyl groups, alkynyl groups, alkoxy groups, alkylcarbonyl groups, arylcarbonyl groups, alkoxycarbonyl groups, aryloxycarbonyl groups, arylthiocarbonyl groups, acyloxy groups, arylthio groups, alkylthio groups, aryl groups, heteroatom-containing aromatic ring groups, aryloxy groups, alkylsulfinyl groups, arylsulfinyl groups, alkylsulfonyl groups, arylsulfonyl groups, alkyleneoxy groups, amino groups, cyano groups and nitro groups, and halogen atoms. The above-described organic groups may be substituted by one or plural substituents selected from the group consisting of these respective groups and halogen atoms. The organic groups may be bonded to $S^+$ in the formula g1 through these substituents.

More specifically, examples of these substituents include alkyl groups having 1 to 6 carbon atoms (for example, methyl, ethyl, propyl, isopropyl and butyl groups), a hydroxyl group, cycloalkyl groups having 3 to 6 carbon atoms (for example, cyclopropyl, cyclobutyl, cyclopentyl and cyclohexyl groups), alkenyl groups having 2 to 6 carbon atoms (for example, vinyl, 1-propenyl, 2-propenyl and 2-butenyl groups), alkynyl groups having 2 to 6 carbon atoms (for example, acetylenyl, 1-propinyl, 2-propinyl and 2-butynyl groups), alkoxy groups having 1 to 6 carbon atoms (for example, methoxy, ethoxy, n-propoxy, isopropoxy, n-butoxy and tert-butoxy groups), alkylcarbonyl groups having 2 to 6 carbon atoms, arylcarbonyl groups having 7 to 11 carbon atoms, alkoxycarbonyl groups having 2 to 6 carbon atoms (for example, methoxycarbonyl, ethoxycarbonyl and tert-butoxycarbonyl groups), aryloxycarbonyl groups having 7 to 11 carbon atoms, arylthiocarbonyl groups having 7 to 11 carbon atoms, acyloxy groups having 2 to 6 carbon atoms, arylthio groups having 6 to 10 carbon atoms (for example, phenylthio and naphthylthio groups), alkylthio groups having 1 to 6 carbon atoms (for example, methylthio, ethylthio, n-propylthio, isopropylthio, n-butylthio and tert-butylthio groups), aryl groups having 6 to 14 carbon atoms (for example, phenyl, naphthyl and anthracenyl groups), heteroatom-containing aromatic ring groups having 4 to 8 carbon atoms (for example, furyl and thienyl groups), aryloxy groups having 6 to 10 carbon atoms (for example, phenoxy and naphthoxy groups), alkylsulfinyl groups having 1 to 6 carbon atoms, arylsulfinyl groups having 6 to 10 carbon atoms, alkylsulfonyl groups having 1 to 6 carbon atoms, arylsulfonyl groups having 6 to 10 carbon atoms, alkyleneoxy groups having 1 to 6 carbon atoms, amino groups, cyano groups and nitro groups, and halogen atoms (for example, chlorine, bromine and fluorine atoms). $R_9$ to $R_{11}$ may be the same or different from one another.

$R_9$ and $R_{10}$, $R_{10}$ and $R_{11}$, and $R_9$ and $R_{11}$ may be bonded to each other directly or through a linking group to form a cyclic structure. That is, two or more R groups (for example, $R_9$, $R_{10}$ and $R_{11}$) of $R_9$ to $R_{11}$ may be bonded to one another directly or through a linking group to form a cyclic structure. Incidentally, the number of carbon atoms in this cyclic structure can be calculated in the same manner as in $R_1$ to $R_3$ as described above. When $R_9$ and $R_{10}$, $R_{10}$ and $R_{11}$, or $R_9$ and $R_{11}$ forms a cyclic structure, the numbers of carbon atoms in these cyclic structures are each favorably controlled to 4 or more and 10 or less from the viewpoint of storage stability. When $R_9$, $R_{10}$ and $R_{11}$ are bonded to form a plurality of cyclic structures, the number of carbon atoms in each cyclic structure is favorably controlled to 4 or more and 10 or less. Example of this linking group include —O—, —S—, —SO—, —SO$_2$—, —NH—, —NR$_{33}$—, —CO—, —C(=O)O—, —C(=O) NH—, alkylene groups having 1 to 3 carbon atoms and a phenylene group. Here, $R_{33}$ is an alkyl group having 1 to 5 carbon atoms or an aryl group having 6 to 10 carbon atoms.

The third onium salt (g) can be generated upon exposure, and the cationic polymerization reaction of the epoxy group can be started and accelerated by the action of this acid. Thus, the third onium salt can fulfill a role of assisting the first onium salt (a). As a result, when the third onium salt (g) is used, a pattern higher in resolution can be obtained.

One kind of third onium salt (g) may be used by itself, or plural kinds thereof may be used in combination, i.e., as a mixture.

An exemplary combination of the cation moiety (g1) and the anion moiety (g2) constituting this third onium salt is mentioned below.

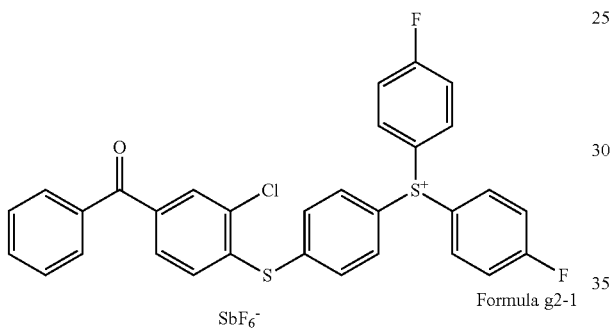

Formula g1-1

Formula g2-1

SbF$_6^-$

As favorable specific examples of the cation moiety (g1), Cation Moiety (g1-1) to Cation Moiety (g1-12) respectively represented by the following formulae g1-1 to g1-12 may be mentioned.

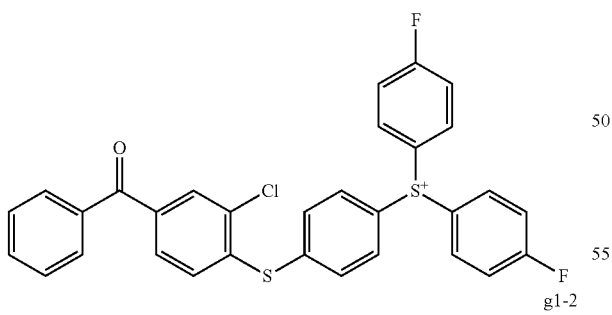

g1-1

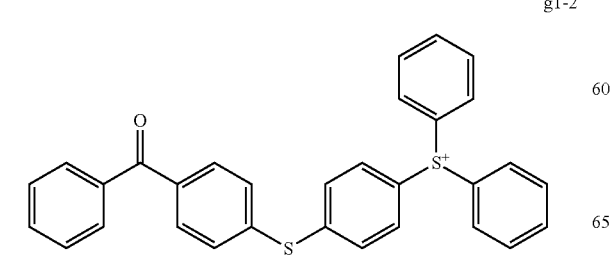

g1-2

-continued

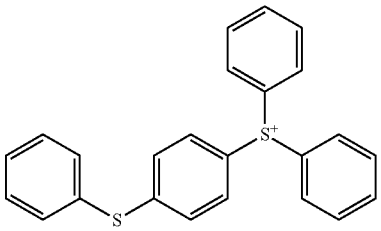

g1-3

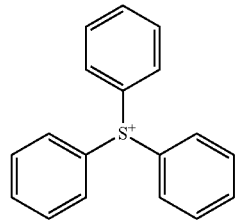

g1-4

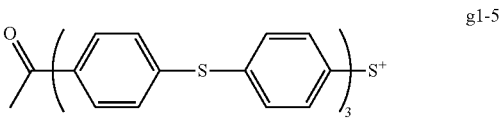

g1-5

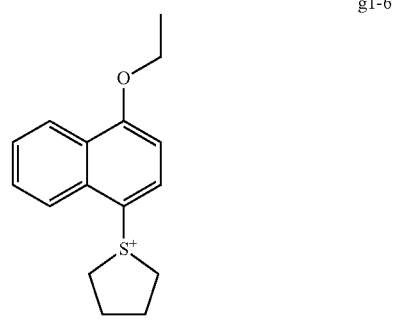

g1-6

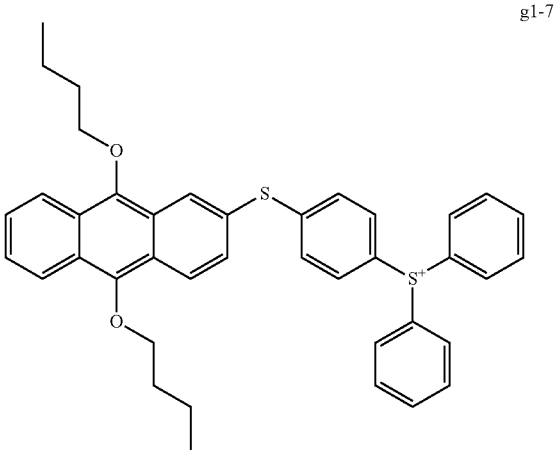

g1-7

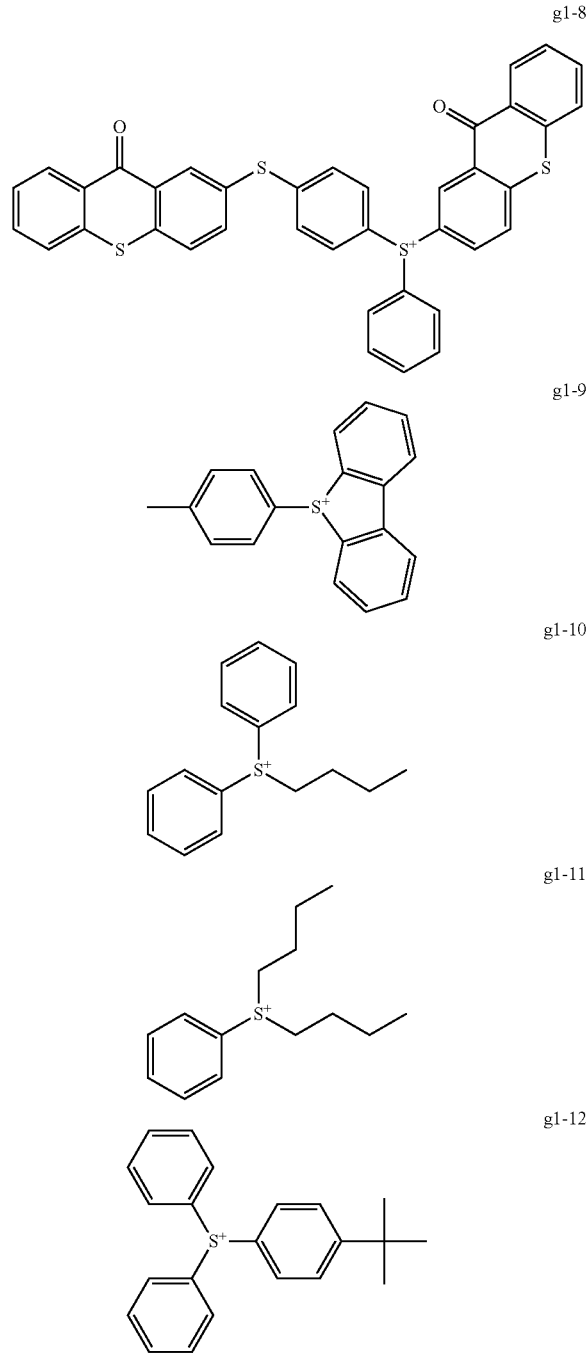

Favorable specific examples of the anion moiety (g2) are mentioned below.

That is, $SbF_6$, $Sb(OH)F_5$, $Sb(OH)_2F_4$, $Sb(OH)_3F_3$, $Sb(OH)_4F_2$, $Sb(OH)_5F$ and $Sb(OH)_6$ may be mentioned.

The content of the third onium salt (g) in the photosensitive negative resin composition is favorably 0.01% by mass or more from the viewpoint of improvement in resolution. In addition, the content of the third onium salt (g) is favorably 20% by mass or less, more favorably 15% by mass or less, from the viewpoint of deposition upon storage.

Third Epoxy Resin (h): Epoxy Resin Containing an Aromatic Group

No particular limitation is imposed on the third epoxy resin (h) so far as the epoxy resin contains an aromatic group. However, a polyfunctional aromatic epoxy resin having two or more epoxy groups in its molecule is favorably used as the third epoxy resin (h) from the viewpoint of improvement in resolution. Examples of such a polyfunctional aromatic epoxy resin include polyfunctional phenol/novolak type epoxy resins, polyfunctional ortho-cresol novolak type epoxy resins, polyfunctional triphenyl novolak type epoxy resins, polyfunctional bisphenol A novolak type epoxy resins, polyfunctional bisphenol F novolak type epoxy resins, polyfunctional bisphenol A type epoxy resins and polyfunctional bisphenol F type epoxy resins. For example, trade name: EPIKOTE 157S70 (product of Japan Epoxy Resin Co., Ltd.), trade name: EP-40005 (product of Daicel Corporation), trade name: EP-40105 (product of Daicel Corporation) and trade name: EPICLON N-865 (product of DIC Corporation) are available as commercially available products and particularly favorably used.

The content of the third epoxy resin (h) in the photosensitive negative resin composition is favorably 0.1% by mass or more and 50% by mass or less, more favorably 0.5% by mass or more and 45% by mass or less, still more favorably 1.0% by mass or more and 40% by mass or less. The third epoxy resin (h) is contained in a proportion of 0.1% by mass or more and 50% by mass or less in the photosensitive negative resin composition, whereby a resist layer having high resolution and proper hardness is easily obtained when such a photosensitive negative resin composition is applied to a support.

Incidentally, one kind of third epoxy resin (h) may be used by itself, or plural kinds thereof may be used in combination.

The use of a resin satisfying both of the requirement for the first epoxy resin (a) (having at least three cyclohexene oxide skeletons in its molecule) and the requirement for the second epoxy resin (e) (containing the alicyclic group different from the cyclohexene oxide skeleton and having a softening point of 70° C. or more) results in the following. That is, the resin satisfying these both requirements is regarded as the first epoxy resin (a), and the content thereof is calculated out.

When a resin satisfying both of the requirement for the first epoxy resin (a) and the requirement for the third epoxy resin (h) (containing the aromatic group) is used, the resin satisfying these both requirements is regarded as the first epoxy resin (a), and the content thereof is calculated. For example, the above-mentioned Resin (a1-11) and Resin (a1-13) satisfy these both requirements.

In addition, when a resin satisfying both of the requirement for the second epoxy resin (e) and the requirement for the third epoxy resin (h) is used, the resin satisfying these both requirements is regarded as the second epoxy resin (e), and the content thereof is calculated.

Further, when a resin satisfying all the requirements for the first epoxy resin (a), the second epoxy resin (e) and the third epoxy resin (h) is used, the resin satisfying these requirements is regarded as the first epoxy resin (a), and the content thereof is calculated.

Other Components

The photosensitive negative resin composition may contain, for example, the following other components than the above-described components (a) to (h). That is, no particular limitation is imposed on the other components, and a surfactant, a sensitizer, a light absorbing agent, a polymerization promoter, a flame retardant and/or a flame-retardant aid may be used according to use applications of the resin composition.

Fine Structure

A fine structure according to the present invention is formed on a substrate and composed of a cured product of the photosensitive negative resin composition according to the present invention. Incidentally, the fine structure means a structure having a pattern controlled by a micron order or less. As examples of the fine structure, may be mentioned a flow path forming layer (nozzle layer) in a liquid ejection head, a color filter in a display, an element and a wiring forming member.

Production Process of Fine Structure

The production process of a fine structure according to the present invention includes the following steps.

(1) A step of arranging the above-described photosensitive negative resin composition on a substrate.

(2) A step of subjecting the photosensitive negative resin composition to a patterning treatment by photolithography using i-line light.

The production process of the fine structure according to the present invention can be applied to, for example, production of a liquid ejection head. No particular limitation is imposed on the liquid ejection head. However, examples thereof include an ink jet recording head for ejecting an ink on a recording medium to conduct recording and liquid ejection heads for production of a biochip and printing of an electronic circuit.

Attention will hereinafter be paid to this ink jet recording head to describe the production process of the fine structure according to the present invention.

Production Process of Ink Jet Recording Head

Figure 2:
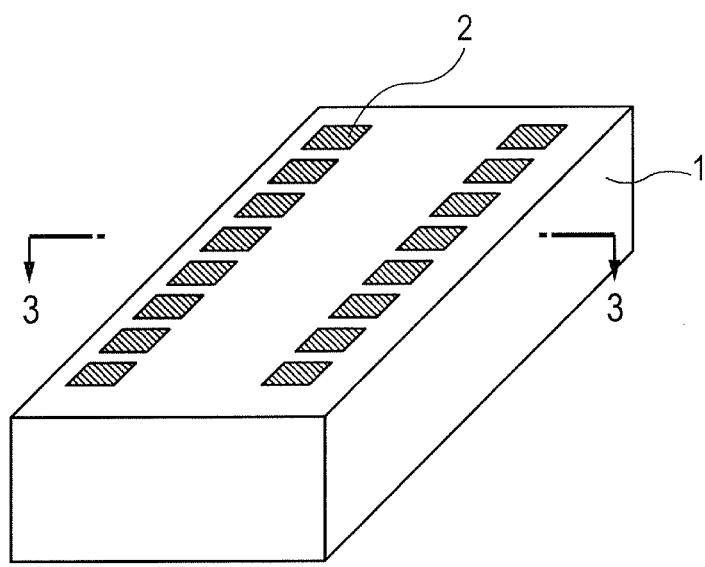
FIG. 2 schematically illustrates a substrate having an energy generating element.

FIG. 1 is a typical perspective view illustrating the construction of an exemplary ink jet recording head. The inkjet recording head illustrated in FIG. 1 has a flow path forming layer 4 forming ink ejection orifices (ejection orifices) 5 and an ink flow path (liquid flow path) 3c communicating with the ink ejection orifices 5 on a substrate having a plurality of energy generating elements 2. An ink supply port (liquid supply port) 6 for supplying an ink (liquid) to the ink flow path 3c is provided in the substrate 1. As illustrated in FIG. 2, a plurality of the energy-generating elements 2 is arranged at a predetermined pitch on the substrate 1. Incidentally, a control signal input electrode (not illustrated) for operating the element is connected to each energy generating element 2.

No particular limitation is imposed on the arrangement density of the ejection orifices in the ink jet recording head. For example, two ejection orifice arrays are formed in the ink jet recording head. At that time, ejection orifices of the ejection orifice array on one side may be arranged at 600 dpi (dots per inch) to adjust the arrangement density of the ejection orifices in the whole ink jet recording head to 1,200 dpi. The arrangement density of the ejection orifice array on one side may also be adjusted as high as 1,200 dpi or more.

As the ink, for example, a pigment dispersion type ink or an ink using a dye and the pigment dispersion type in combination may be used. No particular limitation is imposed on the pigment dispersion type ink. For example, an ink using a pigment (for example, carbon black) as a compound for color development and containing an organic solvent (for example, 2-pyrrolidone) different from that of a dye ink or containing a large amount of an organic solvent may be used.

A production process of the ink jet recording head will hereinafter be described with reference to FIGS. 3A to 3F and FIGS. 4A to 4F. FIGS. 3A to 3F and FIGS. 4A to 4F correspond to sectional views taken along line 3-3 in FIGS. 1 and 2. Incidentally, the production processes illustrated in FIGS. 3A to 3F and FIGS. 4A to 4F are referred to as Production Process 1 and Production Process 2, respectively.

Production Process 1

Figure 3A:
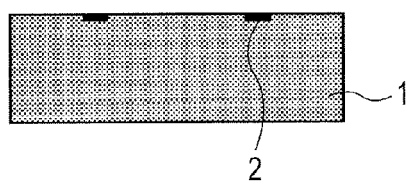
FIGS. 3A, 3B, 3C, 3D, 3E and 3F are schematic process drawings for illustrating an exemplary production process of a fine structure according to the present invention.

A substrate 1 having energy generating elements 2 is first provided as illustrated in FIG. 3A.

The substrate 1 is favorably an Si substrate, particularly favorably a silicon single crystal substrate. When a through-hole is provided in the substrate 1 by anisotropic etching, the substrate is favorably a silicon single crystal substrate having crystal orientation <100>. When a through-hole is provided in the substrate 1 by dry etching, sand blasting or laser machining, the substrate may be a silicon single crystal substrate having crystal orientation <110>.

No particular limitation is imposed on the energy generating elements 2 so far as ejection energy for ejecting an ink droplet can be given to the ink to eject the ink droplet from the ejection orifice. For example, when a heating resistor element is used as the energy generating element, this heating resistor element heats an ink present in the vicinity thereof, thereby causing the ink to bring about a change of state to generate ejection energy.

Figure 3B:
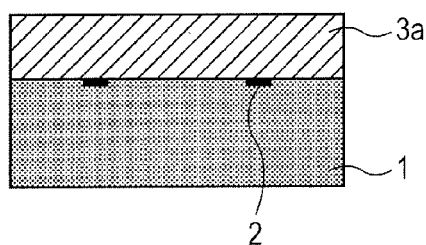

A soluble resin composition is then applied on to the substrate 1 to form a soluble resin layer 3a for an ink flow path pattern as illustrated in FIG. 3B.

As a method for forming the soluble resin layer 3a, for example, a positive photosensitive resin is suitably dissolved in a solvent, and the resultant solution is applied on to the substrate 1 by a spin coating method. Thereafter, the solution applied is heated, whereby the soluble resin layer 3a can be formed. No particular limitation is imposed on the thickness of the soluble resin layer 3a so far as it is a desired height of the ink flow path. However, the thickness is favorably, for example, 2 to 50 μm.

Figure 3C:
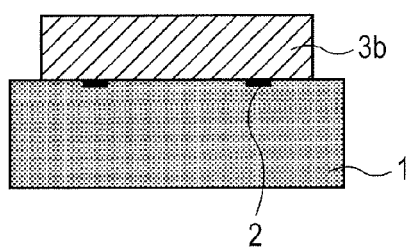

The soluble resin layer 3a is then irradiated with radiation and developed, thereby forming an ink flow path pattern 3b as illustrated in FIG. 3C.

The photosensitive negative resin composition according to the present invention is then arranged on the ink flow path pattern 3b and the substrate 1 to form a photosensitive negative resin composition layer (Step (1)). Incidentally, prebaking (for example, for 9 minutes at 60° C.) may be conducted when the photosensitive negative resin composition layer is formed.

The thickness of the photosensitive negative resin composition layer is favorably 2 μm or more in terms of the thickness on the ink flow path pattern 3b. No particular limitation is imposed on the upper limit of this thickness. However, the upper limit is, for example, 100 μm or less in terms of the thickness on the ink flow path pattern 3b in view of the developability of ink ejection orifice portions. In this manner, the photosensitive negative resin composition layer may be arranged directly on the surface of the substrate, or another layer (for example, an adhesive layer) may also be provided between the substrate and the photosensitive negative resin composition.

Figure 3D:
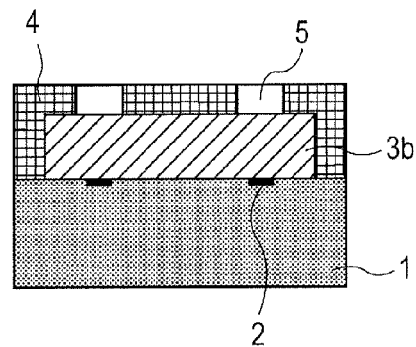

The photosensitive negative resin composition layer is then irradiated with i-line light and then developed with a solvent such as MIBK (methyl isobutyl ketone) to conduct a patterning treatment (Step (2)). A rinsing treatment with a solvent such as isopropyl alcohol (IPA) is further suitably conducted. Post exposure baking (for example, for 4 minutes at 90° C.) is further conducted, thereby forming an ink ejection orifice 5 to produce a flow path forming layer (ink flow path forming layer) 4 in which the ejection orifice pattern and the ink flow path pattern have been formed (FIG. 3D). Incidentally, the center wavelength of the i-line light used upon forming the ink ejection orifice 5 is 365 nm.

Figure 3E:
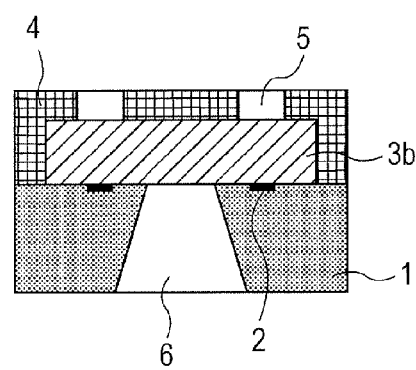

An ink supply port 6 is then formed in the substrate 1 by means of a proper method such as an etching treatment (for example, anisotropic etching) as illustrated in FIG. 3E.

Figure 3F:
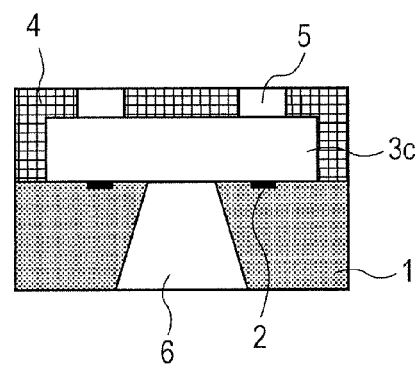

The ink flow path pattern 3b is then dissolved out with a proper solvent to form an ink flow path 3c as illustrated in FIG. 3F. As the proper solvent, for example, an aqueous alkali solution or an organic solvent may be used.

Thereafter, the substrate 1 is cut and separated into a chip by a dicing saw, laser abrasion or dry etching, and electrical joining for driving the energy generating elements 2 is conducted. In addition, a chip tank member for supplying an ink is connected to complete an ink jet recording head.

Incidentally, the above-described process is also useful as a pattern forming process for forming a hollow pattern without being limited to the production process of the ink jet recording head.

Figure 4A:
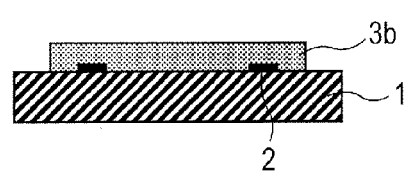
FIGS. 4A, 4B, 4C, 4D, 4E and 4F are schematic process drawings for illustrating another exemplary production process of the fine structure according to the present invention.

Production Process 2:

A soluble resin composition is first applied on to a substrate 1 having energy generating elements 2 to form an ink flow path pattern 3b as illustrated in FIG. 4A.

Figure 4B:
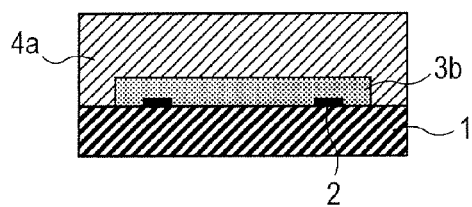

A first photosensitive negative resin composition layer 4a composed of the photosensitive negative resin composition according to the present invention is then formed on the ink flow path pattern 3b and the substrate 1 as illustrated in FIG. 4B.

Figure 4C:
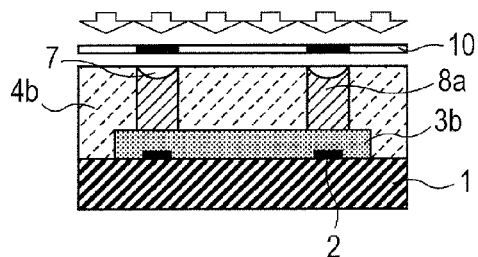

The first photosensitive negative resin composition layer 4a is then irradiated with i-line light through a first photomask 10 as illustrated in FIG. 4C. When first post exposure baking is then conducted, a second photosensitive negative resin composition layer 4b in which a surface depression 7 and a first ejection orifice patter 8a that is a latent image of ejection orifices have been formed is formed. No particular limitation is imposed on the conditions for the first post exposure baking. However, this baking is, for example, a heat treatment for 4 minutes at 100° C.

Figure 4D:
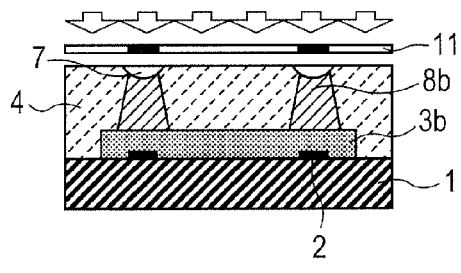

The second photosensitive negative resin composition layer 4b is then irradiated again with i-line light through a second photomask 11 as illustrated in FIG. 4D. The second photomask 11 has an opening portion different from the first photomask 10. At this time, at least part of unexposed portions after the first exposure are subjected to second exposure. When second post exposure baking is then conducted, a second ejection orifice pattern 8b that is a latent image of ejection orifices is newly formed, thereby forming a flow path forming layer 4 in which the ejection orifice pattern and the ink flow path pattern have been formed. No particular limitation is imposed on the conditions for the second post exposure baking. However, this baking is, for example, a heat treatment for 4 minutes at 90° C.

The second photomask 11 is such that light-screening portions of a circular or oval form corresponding to the form of an ejection orifice are present for forming an ejection orifice 5. On the other hand, the first photomask 10 has light-screening portions present at the same positions as the light-screening portions of the second photomask 11 and each having an area wider than that of the second photomask 11 so as to cover the light-screening portion of the second photomask 11. The patterning treatment is conducted with two stages like this Production Process 2, whereby a tapered form can be easily formed at each ejection orifice 5 by the lens effect of light obtained upon the exposure using the recess of the surface depression 7.

Figure 4E:
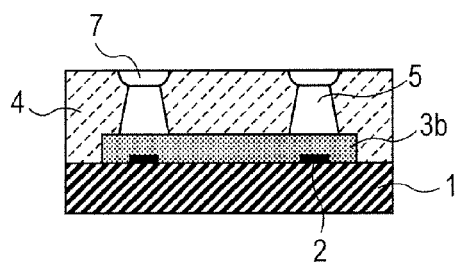

A development treatment is then conducted with MIBK (methyl isobutyl ketone). In addition, a rinsing treatment is further suitably conducted with IPA, thereby forming the ejection orifice 5 as illustrated in FIG. 4E.

Figure 4F:
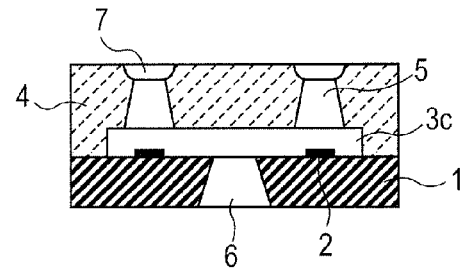

An ink supply port 6 is then formed in the substrate 1 by means of a proper method such as an etching treatment as illustrated in FIG. 4F. The ink flow path pattern 3b is then dissolved out with a proper solvent to form an ink flow path 3c.

Thereafter, the substrate 1 is cut and separated into a chip by a dicing saw, and electrical joining for driving the energy generating elements 2 is conducted. In addition, a chip tank member for supplying an ink is connected to complete an ink jet recording head.

Incidentally, the above-described process is also useful as a pattern-forming process for forming a hollow pattern without being limited to the production process of the ink jet recording head.

EXAMPLES

Examples of the present invention will hereinafter be described. However, the present invention is not limited to these Examples.

Examples 1 to 22

Preparation of photosensitive negative resin composition A first epoxy resin (a), a first onium salt (b), a silane compound (c) and an organic solvent (d), and optionally a second epoxy resin (e), a second onium salt (f), a third onium salt (g), a third epoxy resin (h) and other components were mixed according to the formulations shown in Table 1 to obtain respective photosensitive negative resin compositions. In Table 1, the units of the respective components are part(s) by mass.

Production of Ink Jet Recording Head

A plurality of ink jet recording heads are generally produced with one substrate. However, description will hereinafter be given by directing attention to one inkjet recording head.

Production Process 1

A support (substrate 1) having an energy generating element 2 and composed of a silicon wafer was first provided. A soluble resin composition was then applied on to this substrate 1 to form a soluble resin layer 3a for an ink flow path pattern. The soluble resin layer 3a was then irradiated with radiation and developed, thereby forming an ink flow path pattern 3b.

The photosensitive negative resin composition obtained above was then applied on to the substrate 1 and the ink flow path pattern 3b by a spin coater and then prebaked and dried for 9 minutes at 60° C. to obtain a photosensitive negative resin composition layer. The film thickness of this photosensitive negative resin composition layer on the substrate was 40 μm, and the thickness of this photosensitive negative resin composition layer on the ink flow path pattern 3b was 25 μm.

This photosensitive negative resin composition layer was then subjected to patterning exposure through a mask, in which a pattern for evaluation of sensitivity and resolution, which will be described subsequently, had been formed, by means of trade name: FPA-3000 i5+ (i-line stepper; manufactured by Canon Inc.) and to a post exposure baking treatment for 4 minutes at 90° C. by a hot plate. Incidentally, the defocus setting of the i-line stepper is suitably changed, whereby a desired taper angle of, for example, about −5 to 10° can be achieved. In this patterning exposure, the defocus setting of the i-line stepper was conducted in such a manner that the taper angle was 1°.

The taper angle means an angle formed between a perpendicular line and a side wall (side surface) of the ejection orifice 5, the perpendicular line starting from an endmost point in an ink ejecting direction (in FIG. 3D, the up direction on the sheet) toward the side of the substrate 1.

Thereafter, trade name: CDS-860R+ (manufactured by Canon Inc.) was used to conduct a development treatment, and post baking was conducted for 1 hour at 140° C. by means of an oven to obtain an ink flow path forming layer 4, in which an ejection orifice pattern and the ink flow path pattern had been formed. The ink flow path forming layer 4 is composed of a cured product of the photosensitive negative resin composition. Incidentally, the arrangement density of the ejection orifices was controlled to 1,200 dpi [(600 dpi for one array)×2 arrays].

An ink supply port 6 was then formed in the substrate 1 by an etching treatment. The ink flow path pattern 3b was then dissolved out with a solvent (MIBK: methyl isobutyl ketone) to form an ink flow path 3c. Thereafter, electrical joining for driving the energy generating element 2 was conducted to the resultant substrate. In addition, a chip tank member for supplying an ink was connected to complete an ink jet recording head.

Production Process 2

A soluble resin was first applied on to a substrate (silicon wafer) 1 on which an energy generating element 2 had been provided in the same manner as in Production Process 1 to form an ink flow path pattern 3b. The photosensitive negative resin composition obtained above was then applied on to the ink flow path pattern 3b and the substrate 1 by a spin coater and then prebaked and dried for 9 minutes at 60° C. to form a first photosensitive negative resin composition layer 4a. The film thickness of this first photosensitive negative resin composition layer 4a on the substrate 1 was 40 µm, and the thickness of this first photosensitive negative resin composition layer 4a on the ink flow path pattern 3b was 27 µm.

The first photosensitive negative resin composition layer 4a was then subjected to patterning exposure through a first photomask 10, in which a pattern of a surface depression 7 had been formed, by means of trade name: FPA-3000 i5+ (i-line stepper; manufactured by Canon Inc.) and to a post exposure baking treatment for 4 minutes at 90° C. by a hot plate. At that time, curing advanced in exposed portions of the first photosensitive negative resin composition layer 4a, and so the first photosensitive negative resin composition layer was changed to a second photosensitive negative resin composition layer 4b.

This layer 4b was then subjected to patterning exposure through a second photomask 11, in which a pattern for evaluation of sensitivity and resolution, which will be described subsequently, had been formed, by means of trade name: FPA-3000 i5+ (i-line stepper; manufactured by Canon Inc.) and to a post exposure baking treatment for 4 minutes at 90° C. by a hot plate. Incidentally, at that time, the defocus setting of the i-line stepper was conducted in such a manner that the taper angle is 7°.

Thereafter, trade name: CDS-860R+ (manufactured by Canon Inc.) was used to conduct a development treatment, and post baking was conducted for 1 hour at 140° C. by means of an oven, whereby a second ejection orifice pattern 8b that is a latent image of ejection orifices was newly formed to obtain an ink flow path forming layer 4, in which the ejection orifice pattern and the ink flow path pattern had been formed. Incidentally, the arrangement density of the ejection orifices was controlled to 1,200 dpi [(600 dpi for one array)×2 arrays].

An ink supply port 6 was then formed in the substrate 1 by an etching treatment. The ink flow path pattern 3b was then dissolved out with a solvent (MIBK: methyl isobutyl ketone) to form an ink flow path 3c. Thereafter, electrical joining for driving the energy generating element 2 was conducted to the resultant substrate. In addition, a chip tank member for supplying an ink was connected to complete an ink jet recording head.

Evaluation

Figure 5:
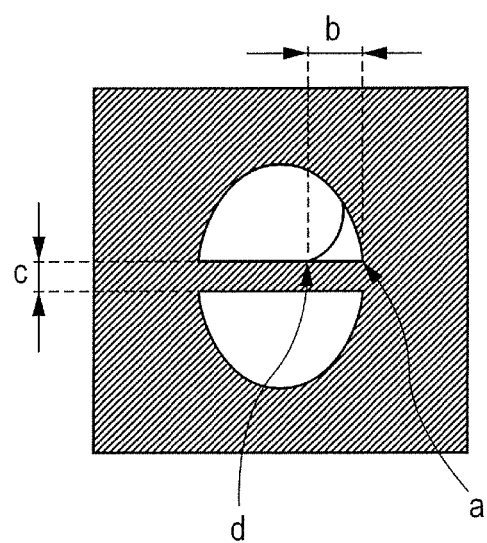
FIG. 5 illustrates a photomask for use in evaluation of sensitivity and resolution.

Photomask in which a Pattern for Evaluation of Sensitivity and Resolution has been Formed In Production Process 1 and Production Process 2, a photomask illustrated in FIG. 5 was used as the photomask (second photomask in Production Process 2). In this photomask, such a pattern that over an oval ejection orifice having a design dimension of 20 µm in major axis and 16 µm in minor axis a line pattern having a width (c in FIG. 5) of 5 µm has been bridged along the minor axis is formed. In the respective production processes, the photomask illustrated in FIG. 5 was used to form a negative resist pattern in the photosensitive negative resin composition layer (layer 4b in Production Process 2). In the mask in FIG. 5, blank portions indicate light-screening portions, and this mask was used to form a hollow pattern.

Sensitivity

The sensitivity of the photosensitive negative resin composition in each Example was evaluated according to the following method. Specifically, the photomask illustrated in FIG. 5 was used to conduct i-line exposure to the photosensitive negative resin composition layer in Production Process 1 of each Example while changing the exposure rate stepwise within a range of from 500 to 30,000 $J/m^2$. Regarding the patterns thus obtained, the exposure rate ($J/m^2$) required for forming a 3 µm width of a central portion of a bridging pattern was measured. The smaller the exposure rate, the higher the sensitivity of the photosensitive negative resin composition.

Incidentally, Production Processes 1 and 2, a negative resist pattern was formed in the photosensitive negative resin composition layer at an exposure rate ($J/m^2$) shown in Table 1 using the photomask illustrated in FIG. 5.

Resolution

A portion of the negative resist pattern formed in the photosensitive negative resin composition layer in each of Production Processes 1 and 2 where the ellipse intersected the bridging line pattern was observed through a scanning electron microscope (SEM) to determine the resolution of the photosensitive negative resin composition. When a virtual straight ling along an edge of the bridging line patter was drawn from a semi-moon shape end portion ('a' in FIG. 5) in the case where a resist pattern could be formed faithfully to the mask pattern, the distance from this semi-moon shape end portion 'a' to the point where the virtual straight line intersects an actually resolved pattern ('b' in FIG. 5) was regarded as the resolution (unit: µm). This means that the resolution becomes 0 µm when the actual pattern is resolved up to the semi-moon shape end portion ('a' in FIG. 5) and indicates that it conforms to a design dimension. However, when the resolution is lowered, a negativated product is left at the semi-moon shape end portion ('a' in FIG. 5). Accordingly, the value of resolution can be determined by the degree of spread of the negativated product ('b' in FIG. 5). Incidentally, the distance from the semi-moon shape end portion 'a' to the intersection point d was present at four places in total for each end portion. However, that poorest in resolution (longest in the distance d) was shown in Table 1 as the resolution in this evaluation.

Pigment Ink Resistance

The ink jet recording head produced according to Production Process 1 or Production Process 2 in each Example was observed through a metallographical microscope to confirm that the substrate 1 and the ink flow path forming layer 4 adhere to each other without leak (hereinafter referred to as initial stage). This ink jet recording head was then immersed in a pigment dispersion type ink (trade name: PGI-39M, product of Canon Inc.). This head was continuously immersed in the pigment dispersion type ink for 7 days while retaining conditions of 60° C. and ordinary pressure ($10^5$ Pa) in an oven. The ink jet recording head after this immersion test was observed again through the metallographical microscope to make evaluation according to the following criteria. Incidentally, when determined to be A, the photosensitive negative resin composition used in the production of such an ink jet recording head may be said to be good in pigment ink resistance.

A: The substrate 1 and the ink flow path forming layer 4 adhere to each other without leak like those of the initial stage.

B: Peeling is observed even in a part.

Comparative Examples 1 to 7

Respective ink jet recording heads were produced in the same manner as in Example 1 except that photosensitive negative resin compositions were respectively prepared according to the formulations shown in Table 1. The photosensitive negative resin composition and ink jet recording head in each example were evaluated in the same manner as in Example 1.

Incidentally, the evaluation of resolution and pigment ink resistance as to Production Process 2 was made on only Examples 4, 14, 16 to 19 and 21, and Comparative Examples 1 and 2.

TABLE 1

| Mixed components | | 1 | 2 | 3 | 4 | 5 | 6 | 7 | 8 | 9 | 10 | 11 |
|---|---|---|---|---|---|---|---|---|---|---|---|---|
| First epoxy resin (a) | GT401*1 | 100 | 100 | 100 | 100 | 100 | 100 | 100 | | | | |
| | GT403*2 | | | | | | | | 40 | 30 | 40 | 40 |
| | GT301*3 | | | | | | | | | | | |
| First onium salt (b) | Cation moiety (b1-1)/Anion moiety (b2-4) | 1.5 | 1.5 | | | | | | | | | |
| | Cation moiety (b1-22)/Anion moiety (b2-22) | | | | | 1.3 | 1.3 | | | | | |
| | Cation moiety (b1-33)/Anion moiety (b2-10) | | | | | | | 1.0 | | | | |
| | Cation moiety (b1-23)/Anion moiety (b2-14) | | | 1.0 | 1.0 | | | | 1.0 | 1.0 | 1.0 | 1.0 |
| | Cation moiety (b1-17)/Anion moiety (b2-12) | | | | | | | | | | | |
| Silane compound (c) | γ-Aminopropyltriethoxysilane*11 | 5 | 5 | 5 | 5 | 5 | 5 | 5 | 5 | 5 | 5 | 5 |
| | γ-Glycidoxypropyltrimethoxysilane*4 | | | | | | | | | | | |
| Organic solvent (d) | Xylene | | | | | | | | | | | |
| | Propylene glycol monomethyl ether | 60 | 60 | 60 | 60 | 60 | 60 | 60 | 60 | 60 | 60 | 60 |
| Second epoxy resin (e) | EHPE 3150*5 | | | | | | | | | 70 | | |
| Second onium salt (f) | Cation moiety (f1-1)/Anion moiety (f2-1) | | | | | | | | | | 0.20 | |
| | Cation moiety (f1-13)/Anion moiety (f2-41) | | | | | | | | | | | 0.15 |
| Third onium salt (g) | Cation moiety (g1-1)/SbF$_6^-$ | | | | | | | | | | | |
| | Cation moiety (g1-8)/Sb(CH)F$_5^-$ | | | | | | | | | | | |
| Third epoxy resin (h) | EP-4000S*6 | | | | | | | | | | | |
| | JER157S70*7 | | | | | | | | | | | |
| | FX512*8 | | | | | | | | | | | |
| Other components | CELLOXIDE 2081*9 | | | | | | | | | | | |
| | Trimellitic anhydride*10 | | | | | | | | | | | |
| | Cation moiety (b1-1)/Anion moiety (b2-24) | | | | | | | | | | | |
| Arrangement density of ejection orifice | | (600 dpi for one array) × 2 arrays = 1200 dpi | | | | | | | | | | |
| Production Process 1 | Sensitivity (J/m²) | 3500 | 5000 | 3000 | 3000 | 4500 | 4500 | 4000 | 3500 | 3500 | 4000 | 4000 |
| | Resolution (μm) | 1.1 | 1.0 | 0.9 | 1.0 | 1.3 | 1.4 | 1.3 | 0.7 | 0.8 | 0.6 | 0.7 |
| | Pigment ink resistance | A | A | A | A | A | A | A | A | A | A | A |
| Production Process 2 | Resolution (μm) | — | — | — | 0.8 | — | — | — | — | — | — | — |
| | Pigment ink resistance | — | — | — | A | — | — | — | — | — | — | — |

| Mixed components | | 12 | 13 | 14 | 15 | 16 | 17 | 18 | 19 | 20 | 21 | 22 |
|---|---|---|---|---|---|---|---|---|---|---|---|---|
| First epoxy resin (a) | GT401*1 | | | | | | | | | | | |
| | GT403*2 | 40 | 40 | 30 | 20 | 30 | 30 | 30 | 20 | 50 | 30 | 30 |
| | GT301*3 | | | | | | | | | | | |
| First onium salt (b) | Cation moiety (b1-1)/Anion moiety (b2-4) | | | | 0.5 | | | | | | | |
| | Cation moiety (b1-22)/Anion moiety (b2-22) | | | | | | | | | | | |
| | Cation moiety (b1-33)/Anion moiety (b2-10) | | | | | | | | | | | |
| | Cation moiety (b1-23)/Anion moiety (b2-14) | | | | | | | | | | | |
| | Cation moiety (b1-17)/Anion moiety (b2-12) | 1.0 | 1.0 | 1.0 | | 1.0 | 1.0 | 1.0 | 1.0 | 1.0 | 1.5 | 1.0 |
| Silane compound (c) | γ-Aminopropyltriethoxysilane*11 | 5 | 5 | 5 | 5 | 5 | 5 | 5 | 5 | 5 | 4 | 5 |
| | γ-Glycidoxypropyltrimethoxysilane*4 | | | | | | 5 | 5 | 5 | 5 | 5 | |
| Organic solvent (d) | Xylene | | | | | | | 55 | 55 | 55 | 55 | |
| | Propylene glycol monomethyl ether | 60 | 60 | 60 | 60 | 60 | 60 | | | | | 60 |

TABLE 1-continued

| | | (continued Examples) | | | | | | | | | |
|---|---|---|---|---|---|---|---|---|---|---|---|
| Second epoxy resin (e) | EHPE 3150*5 | 60 | 60 | 70 | 80 | 60 | 70 | 80 | 40 | 60 | 50 |
| Second onium salt (f) | Cation moiety (f1-1)/Anion moiety (f2-1) | 0.15 | | | | | | | | | |
| Second onium salt (f) | Cation moiety (f1-13)/Anion moiety (f2-41) | | 0.20 | 0.20 | 0.20 | 0.20 | 0.20 | 0.20 | 0.20 | 0.15 | 0.20 |
| Third onium salt (g) | Cation moiety (g1-1)/SbF$_6^-$ | 4.0 | 4.0 | 2.5 | 3.0 | 2.5 | 4.0 | 4.0 | 4.0 | | |
| Third onium salt (g) | Cation moiety (g1-8)/Sb(CH)F$_5^-$ | | | | | | | | | 2.5 | 2.5 |
| Third epoxy resin (h) | EP-4000S*6 | | | | | | | | | 20 | 20 |
| Third epoxy resin (h) | JER157S70*7 | | | | | 10 | 10 | 10 | 10 | | |
| Other components | FX512*8 | | | | | | | | | | |
| | CELLOXIDE 2081*9 | | | | | | | | | | |
| | Trimellitic anhydride*10 | | | | | | | | | | |
| | Cation moiety (f1-1)/Anion moiety (b2-4) | | | | | | | | | | |
| Arrangement density of ejection orifice | | (600 dpi for one array) × 2 arrays = 1200 dpi | | | | | | | | | |
| Production Process 1 | Sensitivity (J/m$^2$) | 3000 | 3000 | 3500 | 4000 | 3500 | 3500 | 3500 | 3000 | 3500 | 3500 |
| | Resolution (μm) | 0.7 | 0.7 | 0.5 | 0.5 | <0.5 | <0.5 | <0.5 | 0.7 | <0.5 | <0.5 |
| | Pigment ink resistance | A | A | A | A | A | A | A | A | A | A |
| Production Process 2 | Resolution (μm) | — | — | <0.5 | — | <0.5 | <0.5 | <0.5 | — | <0.5 | — |
| | Pigment ink resistance | — | — | A | — | A | A | A | — | A | — |

| Mixed components | | Comparative Example | | | | | | |
|---|---|---|---|---|---|---|---|---|
| | | 1 | 2 | 3 | 4 | 5 | 6 | 7 |
| First epoxy resin (a) | Resin (a1-1) GT401*1 | | | 32 | | | | |
| | GT403*2 | | 35 | | | | | |
| | Resin (a1-3) GT301*3 | | | | | | | |
| First onium salt (b) | Cation moiety (b1-22)/Anion moiety (b2-4) | | | | | | | |
| | Cation moiety (b1-22)/Anion moiety (b2-22) | | | | | | | |
| | Cation moiety (b1-33)/Anion moiety (b2-10) | | | | | | | |
| | Cation moiety (b1-23)/Anion moiety (b2-14) | | | | | | | |
| | Cation moiety (b1-17)/Anion moiety (b2-12) | | | | | | | |
| Silane compound (c) | γ-Aminopropyltriethoxysilane*11 | | | | | | | |
| | γ-Glycidoxypropyltrimethoxysilane*4 | | | | | | | |
| Organic solvent (d) | Xylene | | | | | | | |
| | Propylene glycol monomethyl ether | | | | | | | |
| Second epoxy resin (e) | EHPE 3150*5 | | | | | | 100 | |
| Second onium salt (f) | Cation moiety (f1-1)/Anion moiety (f2-1) | | | | | | | |
| | Cation moiety (f1-13)/Anion moiety (f2-41) | | | | | | | |
| Third onium salt (g) | Cation moiety (g1-1)/SbF$_6^-$ | | | | | 1.0 | | 1.0 |
| | Cation moiety (g1-8)/Sb(CH)F$_5^-$ | | | | 5.0 | | | |
| Third epoxy resin (h) | EP-4000S*6 | | | | | | | |
| | JER157S70*7 | | | | 70 | | | |
| Other components | FX512*8 | | | 30 | 60 | 60 | 60 | 60 |
| | CELLOXIDE 2081*9 | 100 | | | 30 | | | 100 |
| | Trimellitic anhydride*10 | | | 30 | | | | |
| | Cation moiety (f1-1)/Anion moiety (b2-4) | 3 | 3 | 10 | | 100 | | 5 |
| | | | 65 | | | | | |
| Arrangement density of ejection orifice | | (600 dpi for one array) × 2 arrays = 1200 dpi | | | | | | |
| Production Process 1 | Sensitivity (J/m$^2$) | 20000 | 15000 | 25000 | 6000 | 3000 | >30000*12 | 8000 |
| | Resolution (μm) | 5.1 | 4.8 | 5.5 | 1.5 | 0.9 | 1.5 | 0.8 |
| | Pigment ink resistance | B | A | A | B | B | — | B |
| Production Process 2 | Resolution (μm) | 100 | | | | | | |
| | Pigment ink resistance | — | — | — | — | — | — | — |

TABLE 1-continued

| Production Process 2 | Resolution (μm) | Pigment ink resistance |
|---|---|---|
| | 4.1 | B |
| | 4.0 | A |
| | — | — |
| | — | — |
| | — | — |
| | — | — |
| | — | — |

*¹Trade name: Epolead GT401 (product of Daicel Corporation); epoxy equivalent: 210 to 225.
*²Trade name: Epolead GT403 (product of Daicel Corporation); epoxy equivalent: 270 to 300.
*³Trade name: Epolead GT301 (product of Daicel Corporation); epoxy equivalent: 185 to 205.
*⁴Trade name: SILQUEST A-187 SILANE (product of Momentive Performance Materials Japan, Inc.).
*⁵Trade name: EHPE 3150 (product of Daicel Corporation); epoxy equivalent: 180, softening point: 85° C.
*⁶Trade name: EP-4000S (product of Daicel Corporation); epoxy equivalent: 260.
*⁷Trade name: JER157S70 (product of Japan Epoxy Resin Co., Ltd.); epoxy equivalent: 210, softening point: 70° C.
*⁸Trade name: FX512 (product of 3M Co.).
*⁹Trade name: CELLOXIDE 2081 (product of Daicel Corporation) having the following structural formula

*¹⁰Trimellitic anhydride (TA) (product of Tokyo Chemical Industry Co., Ltd.).
*¹¹Trade name: SILQUEST A-1100 SILANE (product of Momentive Performance Materials Japan, Inc.).
*¹²No pattern could be formed even at 30000 (J/m²) (insufficient exposure rate). Accordingly, the evaluation of resolution and pigment ink resistance was not made.

The photosensitive negative resin compositions of Examples 1 to 22 containing the first epoxy resin (a), the first onium salt (b), the silane compound (c) and the organic solvent (d) were high in sensitivity and resolution and could respectively produce an ink jet recording head having a flow path forming layer (patterned cured product) excellent in pigment ink resistance.

On the other hand, the flow path forming layer produced by using each of the photosensitive negative resin compositions of Comparative Examples 1 to 7 did not sufficiently achieve all of sensitivity, resolution and pigment ink resistance at the same time.

As described above, the photosensitive negative resin composition according to the present invention is high in sensitivity and resolution and can form a nozzle excellent in pigment ink resistance. Accordingly, the resin composition can be suitably used in various kinds of devices subjected to microprocessing for MEMS, represented by ink jet. According to the present invention, there can be provided a photosensitive negative resin composition capable of producing a fine structure (for example, a nozzle) excellent in pigment ink resistance with high sensitivity and high resolution when a photolithographic process is applied thereto. According to the present invention, there can also be produced a fine structure using this photosensitive negative resin composition, a production process thereof and a liquid ejection head.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-018673, filed on Jan. 31, 2012, which is hereby incorporated by reference herein in its entirety.

The invention claimed is:

1. A photosensitive negative resin composition comprising a resin (a) having at least three cyclohexene oxide skeletons in its molecule,
an onium salt (b) composed of a cation moiety structure represented by the following formula b1 and an anion moiety structure represented by the following formula b2,
a silane compound (c), and
an organic solvent (d):

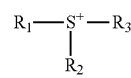

Formula b1

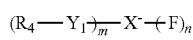

Formula b2

[wherein $R_1$ to $R_3$ are, independently of one another, an organic group which may be substituted and has 1 to 30 carbon atoms, with the proviso that two or more oxygen atoms are included in all atoms constituting $R_1$ to $R_3$, $R_1$ and $R_2$, $R_2$ and $R_3$, and $R_1$ and $R_3$ may be bonded to each other directly or through a linking group to form a cyclic structure,
$R_4$ is a hydrocarbon group which may be substituted by a fluorine atom and has 1 to 30 carbon atoms, X is a carbon atom, a nitrogen atom, a phosphorus atom or a boron atom, $Y_1$ is $-S(=O)_2-$, an alkylene fluoride group, $-*_1-O-CF_2-$, $-*_1-C(=O)-CF_2-$, $-*_1-O-C(=O)-CF_2-$, $-*_1-C(=O)-O-CF_2-$ or a single bond,
where $*_1$ designates an end bonded to $R_4$,
n is 0, 1 or 2 when X is the carbon atom, with the proviso that a total of m and n is 3,
n is 0 or 1 when X is the nitrogen atom, with the proviso that a total of m and n is 2,
n is an integer of 0 or more and 6 or less when X is the phosphorus atom, with the proviso that a total of m and n is 6,
n is an integer of 0 or more and 3 or less when X is the boron atom, with the proviso that a total of m and n is 4, and
when m is an integer of two or more, any carbon atom in one $R_4-Y_1-$ group of two or more $R_4-Y_1-$ groups bonded to X may be bonded to any carbon atom in another one $R_4-Y_1-$ group thereof through a single bond, thereby forming a cyclic structure].

2. The photosensitive negative resin composition according to claim 1, wherein the resin (a) is represented by the following formula a1:

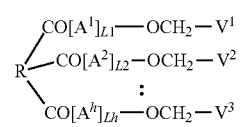

Formula a1

[wherein R is a hydrocarbon group which may contain one or both of an alicyclic epoxy group and an ester group ($-C(=O)-O-$) and has 1 to 30 carbon atoms,
$A^1$ to $A^h$ are, independently of one another, a group composed of a linear or branched alkyl group having 1 to 9 carbon atoms and a group selected from the group consisting of $-O-$ and $-C(=O)-$,
$V^1$ to $V^h$ are, independently of one another, a group represented by the following formula a2, $L_1$ to $L_h$ are, independently of one another, a number of 0 or more, and,
h in $A^h$, $L_h$ and $V^h$ is an integer of 2 or more, with the proviso that when h is 2, R contains at least one cyclohexene oxide skeleton],

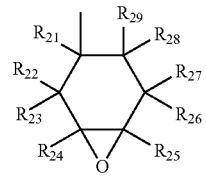

Formula a2

[wherein $R_{21}$ to $R_{29}$ are, independently of one another, a hydrogen atom or an alkyl group having 1 to 9 carbon atoms].

3. The photosensitive negative resin composition according to claim 1, which further comprises an epoxy resin (e) containing an alicyclic group that is different from the cyclohexene oxide skeleton and has a softening point of 70° C. or more.

4. The photosensitive negative resin composition according to claim 1, which further comprises a second onium salt (f) composed of a cation moiety structure represented by the following formula f1 and an anion moiety structure represented by the following formula f2:

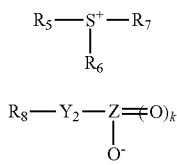

Formula f1

Formula f2

[wherein $R_5$ to $R_7$ are, independently of one another, an organic group which may be substituted and has 1 to 15 carbon atoms, with the proviso that $R_5$ and $R_6$, $R_6$ and $R_7$, and $R_5$ and $R_7$ may be bonded to each other directly or through a linking group to form a cyclic structure, $R_8$ is a hydrocarbon group which may contain a heteroatom and has 1 to 20 carbon atoms, $Y_2$ is a methylene group, $-CH_2-C(=O)-*_2$, $-CH_2-C(=O)-O-*_2$, $-CH_2-O-CF_2-*_2$, $-CH_2-C(=O)-CF_2-*_2$, $-CH_2-O-C(=O)-CF_2-*_2$, $-CH_2-C(=O)-O-CF_2-*_2$ or a single bond, with the proviso that $*_2$ designates an end bonded to $R_8$, and Z is a carbon atom or a sulfur atom, with the proviso that k is 1 when Z is the carbon atoms or is 2 when Z is the sulfur atom].

5. The photosensitive negative resin composition according to claim 4, wherein Z in the formula f2 is the sulfur atom.

6. The photosensitive negative resin composition according to claim 1, which further comprises a third onium salt (g) composed of a cation moiety structure represented by the following formula g1 and an anion moiety structure represented by the following formula g2:

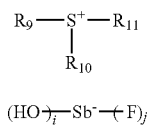

Formula g1

Formula g2

[wherein $R_9$ to $R_{11}$ are, independently of one another, an organic group which may be substituted and has 1 to 30 carbon atoms, with the proviso that $R_9$ and $R_{10}$, $R_{10}$ and $R_{11}$, and $R_9$ and $R_{11}$ may be bonded to each other directly or through a linking group to form a cyclic structure, and i is an integer of 0 or more and 6 or less, with the proviso that a total of i and j is 6].

7. The photosensitive negative resin composition according to claim 1, wherein X in the formula b2 is the phosphorus atom.

8. The photosensitive negative resin composition according to claim 1, which further comprises an epoxy resin (h) containing an aromatic group.

9. A fine structure formed on a substrate, wherein the fine structure is a cured product of the photosensitive negative resin composition according to claim 1.

10. A liquid ejection head having a flow path forming layer formed by the fine structure according to claim 9.

11. A production process of a fine structure, comprising
 (1) a step of arranging the photosensitive negative resin composition according to claim 1 on a substrate, and
 (2) a step of subjecting the photosensitive negative resin composition to a patterning treatment by photolithography using i-line light.

\* \* \* \* \*